US008653819B2

(12) United States Patent
Barmatz et al.

(10) Patent No.: US 8,653,819 B2
(45) Date of Patent: Feb. 18, 2014

(54) TECHNIQUE FOR PERFORMING DIELECTRIC PROPERTY MEASUREMENTS AT MICROWAVE FREQUENCIES

(75) Inventors: Martin B. Barmatz, La Crescenta, CA (US); Henry W. Jackson, La Verne, CA (US)

(73) Assignee: California Institute of Technology, Pasadena, CA (US)

( * ) Notice: Subject to any disclaimer, the term of this patent is extended or adjusted under 35 U.S.C. 154(b) by 585 days.

(21) Appl. No.: 12/874,484

(22) Filed: Sep. 2, 2010

(65) Prior Publication Data

US 2011/0057653 A1    Mar. 10, 2011

Related U.S. Application Data

(60) Provisional application No. 61/240,564, filed on Sep. 8, 2009.

(51) Int. Cl.
  *G01V 3/00* (2006.01)
(52) U.S. Cl.
  USPC ............................................. 324/316
(58) Field of Classification Search
  USPC ................................. 324/300–322
  See application file for complete search history.

(56) References Cited

U.S. PATENT DOCUMENTS

| 5,363,050 | A | * | 11/1994 | Guo et al. | 324/638 |
| 5,869,965 | A | * | 2/1999 | Du et al. | 324/309 |
| 5,877,629 | A | * | 3/1999 | King et al. | 324/309 |
| 5,917,323 | A | * | 6/1999 | Du et al. | 324/309 |
| 5,923,168 | A | * | 7/1999 | Zhou et al. | 324/309 |
| 5,987,672 | A | * | 11/1999 | Oosterwaal | 5/601 |
| 5,998,996 | A | * | 12/1999 | Bernstein et al. | 324/309 |
| 6,064,154 | A | * | 5/2000 | Crouch et al. | 315/39.57 |
| 6,064,205 | A | * | 5/2000 | Zhou et al. | 324/309 |
| 6,498,487 | B1 | * | 12/2002 | Haner | 324/318 |
| 6,674,285 | B2 | * | 1/2004 | Haner | 324/318 |
| 7,378,849 | B2 | * | 5/2008 | Weatherall et al. | 324/321 |
| 7,463,121 | B2 | * | 12/2008 | D'Ostilio | 333/223 |
| 7,652,950 | B2 | * | 1/2010 | Sinha et al. | 367/31 |
| 8,311,641 | B2 | * | 11/2012 | Zhu et al. | 607/103 |
| 2009/0102458 | A1 | | 4/2009 | Ledieu et al. | |

FOREIGN PATENT DOCUMENTS

| EP | 2075599 | 7/2009 |
| JP | 7225200 | 8/1995 |
| JP | 2002/214161 | 7/2002 |
| JP | 2004/045287 | 2/2004 |
| JP | 2005/062152 | 3/2005 |

OTHER PUBLICATIONS

International Search Report mailed May 23, 2011, International application No. PCT/US2010/047700, International filing date Sep. 2, 2010.

(Continued)

*Primary Examiner* — Dixomara Vargas
(74) *Attorney, Agent, or Firm* — Gates & Cooper LLP

(57) ABSTRACT

A method, system, apparatus, and computer readable medium has been provided with the ability to obtain a complex permittivity $\in$ or a complex permeability $\mu$ of a sample in a cavity. One or more complex-valued resonance frequencies ($f_m$) of the cavity, wherein each $f_m$ is a measurement, are obtained. Maxwell's equations are solved exactly for $\in$, and/or $\mu$, using the $f_m$ as known quantities, thereby obtaining the $\in$ and/or $\mu$ of the sample.

25 Claims, 10 Drawing Sheets

(56) References Cited

OTHER PUBLICATIONS

Barmatz, M., "Microwave dielectric property measurement of icy materials and applications: a new technique for performing dielectric property measurements," presented at the first internal JPL Ices Labs Workshop, Feb. 3, 2009.

Barmatz, M. et al., "Technique for performing dielectric property measurements at microwave frequencies," at http.//www.techbriefs.com/component/content/article/8328 and p. 58 of Tech Briefs, Aug. 2010 issue (Books and Reports).

Jackson, H. et al., "Microwave power absorption profile in a cylindrical sample contained in a resonant cylindrical cavity," MRS Symp. Proc., vol. 347, 317, 1994.

Meng, B. et al., "Extended cavity perturbation technique to determine the complex permittivity of dielectric materials," IEEE Trans. Microwave Theory Tech. 43, 2633, 1995.

Parkash, A. et al., "Measurement of dielectric parameters at microwave frequencies by cavity perturbation technique," IEEE Trans. Microwave Theory Tech. 27, 791, 1979.

Pozar, D., "Microwave Engineering," $3^{rd}$ Edition, 2005, John Wiley & Sons, Inc., p. 32, eq. 1.125, p. 33, eq. 1.131 and p. 268, eq. 6.7.

Sphicopoulos, T. et al., "Theoretical basis for the design of the radially stratified dielectric-loaded cavities used in miniaturised atomic frequency standards," IEE Proceedings, 131, pt. H, No. 2, 94, 1984.

Friedlander, F. et al., "Comparison of finite-difference and analytic microwave calculation methods," MRS Symp. Proc., 430, 333 (1996).

Jackson, H. et al., "Steady state temperature profile in a cylinder heated by microwaves," Ceramic Transactions, 59, 279 (1995).

Jackson, H. et al., "Transient temperature distributions in a cylinder heated by microwaves," MRS Symp. Proc., 430, 571 (1996).

\* cited by examiner

TECHNIQUE FOR PERFORMING DIELECTRIC PROPERTY MEASUREMENTS AT MICROWAVE FREQUENCIES

CROSS REFERENCE TO RELATED APPLICATIONS

This application claims the benefit under 35 U.S.C. Section 119(e) of the following co-pending and commonly-assigned U.S. provisional patent application, which is incorporated by reference herein:

Provisional Application Ser. No. 61/240,564, filed on Sep. 8, 2009, by Martin B. Barmatz and Henry W. Jackson, entitled "NEW TECHNIQUE FOR PERFORMING DIELECTRIC PROPERTY MEASUREMENTS AT MICROWAVE FREQUENCIES."

STATEMENT REGARDING FEDERALLY SPONSORED RESEARCH AND DEVELOPMENT

The invention described herein was made in the performance of work under a NASA contract, and is subject to the provisions of Public Law 96-517 (35 U.S.C. Section 202) in which the Contractor has elected to retain title.

BACKGROUND OF THE INVENTION

1. Field of the Invention

This invention relates to a method for obtaining dielectric and magnetic constants for a sample, and an apparatus for performing the same.

2. Description of the Related Art (Note: This application references a number of different publications as indicated throughout the specification by one or more author names and/or years within parentheses, e.g., (Name, year). A list of these different publications ordered according to these reference numbers can be found below in the section entitled "References." Each of these publications is incorporated by reference herein.)

Most microwave dielectric property measurements rely on a cavity perturbation approach that requires very small solid samples (Meng et al., 1995). Cavity perturbation methods are only approximate and have several assumptions that have to be satisfied to obtain accurate results. In the conventional cavity perturbation approach, it is assumed that the sample is sufficiently small, so that the perturbation in the electric and magnetic fields with the sample inserted in the cavity is negligible. It is also assumed that the difference between the quality factors of the cavity, due to the cavity wall loss with and without the sample, is negligible. These assumptions limit the sample volume to be only a few percent of the cavity volume in order to obtain accurate results.

SUMMARY OF THE INVENTION

The present invention has performed the additional calculations that enables one to arrive at an even more accurate determination of the complex dielectric constant (more accurate than a cavity perturbation approach, for example). This improved approach is particularly important when working with liquid samples, larger solid or liquid samples, or samples with larger dielectric constants that further perturb the cavity electromagnetic fields.

The present invention may solve Maxwell's equations for dielectric and magnetic properties by knowing the cavity quality factor before and after the sample is inserted, and then matching the solutions of Maxwell's equations with experiment. The Maxwell's equations, applied to this invention, may be solved using a unique root finder approach.

Thus, to overcome the limitations in the prior art, and to overcome other limitations that will become apparent upon reading and understanding the present specification, the present invention discloses a method of obtaining at least one property selected from a complex-valued dielectric permittivity ($\in$), and a complex valued magnetic permeability ($\mu$) of at least one sample, comprising obtaining one or more complex-valued resonance frequencies ($f_m$) of the cavity wherein each $f_m$ is a measurement, the real part (Re) of $f_m$ being the measured cavity resonant frequency, and the imaginary part (Im) of $f_m$ being related to the measured cavity quality factor ($Q_m$) by Im ($f_m$)=Re ($f_m$)/2 $Q_m$, and solving Maxwell's equations (Sphicopoulos et al., 1984), after including wall losses, to then solve exactly for $\in$ or $\mu$, using the $f_m$ as known quantities, thereby obtaining the $\in$ or $\mu$ of the sample.

Both $\in$ and $\mu$ are complex valued such that $\in$=Re($\in$)+jIm ($\in$) and $\mu$=Re($\mu$)+jIm($\mu$).

The method may comprise obtaining one measured complex-valued resonance frequency $f_m$=$f_{cavity}$ of the cavity when empty; obtaining one measured complex-valued resonance frequency $f_m$=$f_{sample}$ of the cavity containing the sample, wherein $f_{cavity}$ and $f_{sample}$ are measurements obtained by exciting the cavity with one or more cavity resonant modes; and solving Maxwell's equations exactly for the $\in$ or $\mu$, using the $f_{cavity}$ and the $f_{sample}$.

The exciting of cavity modes may comprise exciting cavity resonant frequencies to produce electric and magnetic fields in the cavity.

The method may further comprise obtaining one measured complex-valued resonance frequency $f_{holder}$ of the cavity comprising the sample holder without the sample.

The cavity and the sample may be annular or cylindrical regions.

The solving step may further comprise solving the Maxwell's equations for a complex-valued resonance frequency f of the cavity including the sample, wherein the f may be a function of the $\in$, and/or $\mu$.

The solving step may further comprise solving the Maxwell's equations for a complex-valued resonance frequency g of the cavity including the sample holder without the sample, wherein the g is a function of the $\in_{holder}$.

The cavity may comprise one or more additional materials having known material dielectric permittivities and known material magnetic permeabilities, such that the sample's $\in$ or $\mu$ are the only unknowns during the solving step.

More generally, the method may further comprise solving Maxwell's equations for complex-valued resonance frequency f({$\in_i$, $\mu_i$}), where a complex valued dielectric permittivity $\in_i$ and complex valued magnetic permeability $\mu_i$ are assigned for each zone i in a set {i=1, 2, . . . N} of annular regions and a central cylinder, the set of zones {i} comprising the interior of the cylindrical cavity (Sphicopoulos et. al., 1984).

The method may further comprise obtaining an experimentally determined electrical conductivity $\sigma_w$ of the cavity's walls using the $f_{cavity}$. The electrical conductivity $\sigma_w$ of the cavity walls may be obtained using the $f_{cavity}$ and known formulas for the complex-valued f of the empty cavity (Wilson et. al., 1949).

The present invention may use the $\sigma_w$ to modify the f and/or g to account for a power absorbed by the cavity's walls, thereby obtaining a resultant complex valued resonant frequency F (from f) that is a function of the $\in$ and/or $\mu$, and/or obtaining a resultant complex-valued resonant frequency G (from g) that is a function of the $\in_{holder}$.

More generally, in order to achieve the modification(s) for $f(\{\in_i, \mu_i\})$, the method may further comprise using the surface resistance formula evaluated using the calculated magnetic field corresponding to the frequency $f(\{\in_i, \mu_i\})$, and the electrical conductivity $\sigma_w$ of the cavity walls to obtain the power absorbed $P_{wall}$ and corresponding quality factor $Q_{wall}$ for the cavity walls, and then obtaining the contribution $f_{wall}$=Re $(f \{\in_i, \mu_i\})/2$ $Q_{wall}$ to the imaginary part of the complex-valued resonance frequency, so that the resultant complex-valued resonance frequency being $F(\{\in_i, \mu_i\})=f(\{\in_i, \mu_i\})+j$ $f_{wall}$.

The present invention may further comprise obtaining the $\in$ or $\mu$ by solving $F=f_{sample}$. Alternatively, the method may further comprise obtaining the $\in_{holder}$ by solving $G=f_{holder}$ and then solving of $F=f_{sample}$ using the $\in_{holder}$ obtained by the solving of $G=f_{holder}$.

The method may further comprise obtaining a range of values for the $\in$ or $\mu$, and selecting the value in the range that satisfies $F=f_{sample}$ to any degree of precision desired.

A sample holder may be needed when performing dielectric and/or magnetic measurements on liquids or granular materials. Generally, the sample holder is made of a nonmagnetic dielectric material, such as Teflon or quartz. In many cases, the dielectric properties of these materials can be obtained from the manufacturers. However, when that information is not available, the dielectric properties of the sample holder can be obtained using the present invention. More generally, the method may further comprise obtaining the complex-valued dielectric permittivity of an empty nonmagnetic sample holder $\in_{holder}$ in a zone i=I, or in two non-adjacent zones I and K occupied by the holder, where the dielectric permittivity $\in_i$ for each of the other zones in the set $\{i\}$ is known, by solving $F(\{\in_i\})=f_m$, where $f_m$ is the complex-valued resonance frequency for the cavity containing an empty sample holder.

The method may further include obtaining the complex-valued dielectric permittivity $\in_{sample}$ of a nonmagnetic sample, in a zone i=J, contained in a sample holder, where the complex-valued permittivity $\in_i$ for each of the other zones in the set $\{i\}$ is known, by solving $F(\{\in_i\})=f_m$, where $f_m$ is the complex-valued resonance frequency for the cavity containing a sample in a sample holder.

The sample may be large and/or lossy enough to perturb cavity modes of the cavity. For example, the sample may fill between 1% and 95% of the volume of the cavity. However, in the present invention, the sample may be of any size relative to the cavity volume.

Transverse Magnetic ($TM_{0n0}$) modes, wherein n is a positive integer, may be used to excite the cylindrical cavity. The integer n may be, but is not limited to, between one and three.

The sample may be non-magnetic, have any size, and be positioned along the cavity's axis.

To obtain the $\mu$ of the sample that is magnetic, the cavity resonant modes may comprise at least one $TM_{0n0}$ mode, and a magnetic field and an electric field associated with the $TM_{0n0}$ mode. The method may then further comprise performing the steps of the present invention for the sample that is a first cylindrical sample positioned along the cavity's axis, the first cylindrical sample having a first radius that is sufficiently small so that the magnetic field's strength at the surface at the first radius' end, is negligible, thereby allowing the Maxwell's equations and the F to be solved for only one unknown, the dielectric permittivity of the sample ($\in_{sample}$).

Next, the steps of the present invention may be performed for the same sample that is a second cylinder comprising a same material as the first cylinder, and having a larger radius than the first radius, such that the second cylinder positioned along the axis experiences both the magnetic field and the electric field, thereby allowing the Maxwell's equations and the F to be solved for only one unknown, the $\mu$, using the $\in$ obtained with the first cylinder.

If it is desired to use only one sample for measuring both the permittivity and permeability, the present invention may place an annular sample (or a liquid or powder in an annular holder) located at a radius value associated with the maximum electric field for the $TM_{020}$ mode (where the magnetic field is zero). Measurements for this $TM_{020}$ mode may determine the sample permittivity $\in_{sample}$. Then, using the $TM_{020}$ mode, where the same sample may be in both the magnetic and electric fields, the present invention may back out the sample permeability knowing its permittivity. With this approach, the present invention may assume that the permittivity does not change significantly between the frequencies of the $TM_{020}$ and $TM_{010}$ modes.

The method may further comprise using the $\in$ or $\mu$ to interpret remote sensing data obtained from extra-terrestrial or terrestrial material, thereby identifying one or more compositions, optical properties, or dimensions of the material; and transmitting, storing, or displaying the compositions, optical properties, or dimensions of the material.

The solving of $F=f_{sample}$ further may further comprise finding roots of $F-f_{sample}=0$, by: (i) specifying a range of values for z within a first rectangle in a complex plane, wherein the z are complex numbers in a complex plane; (ii) introducing a mesh into the first rectangle, thereby forming the mesh comprising mesh points at corners of second rectangles, wherein the second rectangles are smaller than the first rectangles; (iii) evaluating Re F(z) at each of the mesh points; (iv) determining one or more first sides of the second rectangles where the Re F(z) changes sign; (v) evaluating Im F(z) at each of the mesh points; (vi) determining one or more second sides of the second rectangles where the Im F($\in$) changes sign; (vii) selecting the second rectangles having both the first sides and second sides, where both the Re F(z) and the Im F(z) change sign, to obtain selected second rectangles; (viii) interpolating the Re F(z) in the selected second rectangles to define a Re F(z) null line; (ix) interpolating the Im F(z) in the selected second rectangles to define an Im F(z) null line; (x) finding a first intersection point between the Re F(z) null line and the Im F(z) null line; (xi) setting the second rectangle as the first rectangle and repeating steps (i)-(x) using the second rectangle as the first rectangle, thereby finding a second intersection point; (xii) obtaining a difference between the first intersection point and the second intersection point, and comparing the difference with a precision parameter that is equal to a desired precision; (xiii) repeating the method until the difference is at least as small as the precision parameter, thereby obtaining a final intersection point; (xiv) and setting the final intersection point equal to the property.

BRIEF DESCRIPTION OF THE DRAWINGS

Referring now to the drawings in which like reference numbers represent corresponding parts throughout:

FIG. 2(*b*) is a cross-sectional schematic of the cylindrical cavity of FIG. 2(*a*) containing an empty annulus holder, according to one or more embodiments of the present invention;

FIG. 2(*c*) is a cross-sectional schematic of the cylindrical cavity of FIG. 2(*a*) containing the annular sample in the cylindrical annulus holder; according to one or more embodiments of the present invention;

DETAILED DESCRIPTION OF THE INVENTION

Figure 1A:
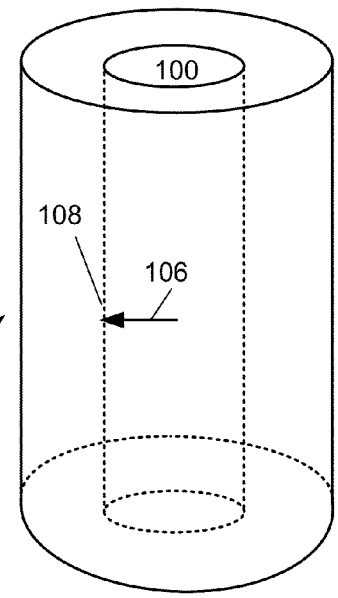
FIG. 1(a) illustrates a simple embodiment comprising a cylindrical sample along the cylindrical cavity's axis, according to one or more embodiments of the present invention.

In the following description of the preferred embodiment, reference is made to the accompanying drawings, which form a part hereof, and in which is shown by way of illustration a specific embodiment in which the invention may be practiced. It is to be understood that other embodiments may be utilized and structural changes may be made without departing from the scope of the present invention.

Overview

The present invention discusses the need to perform accurate dielectric and magnetic property measurements on larger sized samples, particularly liquids at microwave frequencies. These types of measurements cannot be obtained with accuracy using conventional cavity perturbation methods, particularly for liquids, powdered, or granulated solids that require a surrounding container. To solve this problem, a model has been developed for the resonant frequency and quality factor of a cylindrical microwave cavity containing concentric cylindrical samples. This model can then be inverted to obtain the real and imaginary dielectric and magnetic constants of the material of interest.

The present invention may also determine the $\mu$ of a magnetic material, however, in this case, there may be typically 4 unknowns (real and imaginary parts of both $\in$ and $\mu$), and the sample may be measured to isolate and determine each unknown separately.

The approach is based on using exact solutions to Maxwell's equations for the resonant properties of a cylindrical microwave cavity, and also using the effective electrical conductivity of the cavity walls that is estimated from the measured empty cavity quality factor. This new approach calculates the complex resonant frequency and associated electromagnetic fields for a cylindrical microwave cavity with lossy walls, that is loaded with concentric, axially aligned, lossy dielectric and/or magnetic cylindrical samples. In this approach, the calculated complex resonant frequency, consisting of real and imaginary parts, is related to the experimentally measured quantities.

Because this approach uses Maxwell's equations to determine the perturbed electromagnetic fields in the cavity with the material(s) inserted, one can calculate the expected wall losses using the fields for the loaded cavity rather than just depending on the value of the fields obtained from the empty cavity quality factor. These additional calculations provide a more accurate determination of the complex dielectric constant of the material being studied. The improved approach may be important when working with larger samples, or samples with larger dielectric constants that will further perturb the cavity electromagnetic fields. Also, this approach enables a larger sample of interest, such as a liquid or powdered or granulated solid, inside a cylindrical container.

Technical Description

The new technique of the present invention takes advantage of a theoretical model previously developed at JPL (Jackson et al., 1994). This more exact approach is based on exact solutions to Maxwell's equations for the resonant properties of a cylindrical microwave cavity (Sphicopoulos et al., 1984). The new feature of this measurement approach is the ability to use a cylindrical sample of interest, such as a liquid (like methane or ethane at Titan surface temperature of 92 K), inside a cylindrical container. This new method goes beyond cavity perturbation approaches (Meng et al., 1995) by allowing the diameter of a concentric cylindrical sample and holder to be of arbitrary sizes.

In the mid-1990's, JPL had an active microwave laboratory where many experimental and theoretical studies were undertaken to understand how microwaves interact with materials. This approach was extended for use in earlier JPL studies on microwave processing of materials (Jackson et al., 1994). One theoretical study developed a sophisticated computer program to predict the temperature dependence inside a cylindrical sample as a function of time when a cavity resonance was excited at a given microwave power level (Jackson et al., 1994).

The present invention may be used to obtain the dielectric permittivity and magnetic permeability of samples, by measuring the samples in a cavity with or without a sample holder.

In one embodiment, the present invention is concerned with measurements made on a cylindrical sample inserted along the axis of a cylindrical microwave cavity using the $TM_{0n0}$ modes, whose resonant frequencies are independent of the length of the cavity, and only depend on the radius of the cavity as given in Eq. (1) for an ideal empty cavity.

$$f_{0n0} = c\alpha_{0n}/2\pi a \qquad (1)$$

where c is the speed of light in vacuum, a is the cavity radius, and the constant $\alpha_{0n}$ depends on the value n ($\alpha_{01}=2.405$, for example) and is the $n^{th}$ zero of the $J_0$ Bessel function.

The resonant frequency value of a real experimental cavity may be affected by any changes in the boundary conditions, for example due to holes in the walls or insertion of a small exciter or detector antenna. Of course, the resonant frequency may also change with temperature, since the cavity dimensions may expand or contract depending on the thermal properties of the cavity material.

Figure 1B:
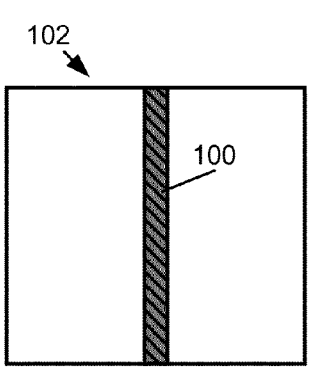
FIG. 1(b) is a cross-sectional schematic of the cylindrical sample in the cylindrical cavity of FIG. 1(a), according to one or more embodiments of the present invention.
Figure 1C:
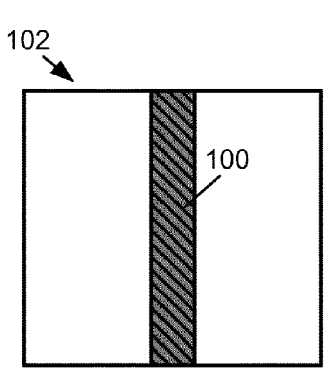
FIG. 1(c) is a cross-sectional schematic of a larger cylindrical sample in the cylindrical cavity of FIG. 1(a), according to one or more embodiments of the present invention.
Figure 1D:
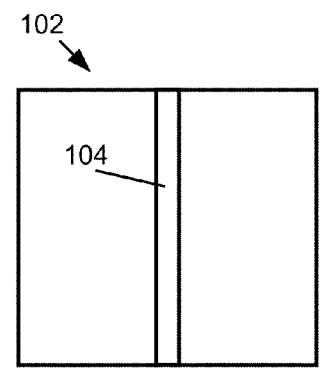
FIG. 1(*d*) is a cross-sectional schematic of the cylindrical cavity comprising an empty cylindrical sample holder, according to one or more embodiments of the present invention.

FIG. 1(a) illustrates a simple embodiment comprising a cylindrical sample 100 (e.g., sample rod, or sample inside a rod) in a cylindrical cavity 102, situated along the cylindrical cavity's axis. FIG. 1(b) is a cross-sectional schematic of the sample 100 in the cavity 102 of FIG. 1(a), FIG. 1(c) is a cross-sectional schematic of a larger sample 100, and FIG. 1(d) is a cross-sectional schematic of the cylindrical cavity 102 comprising an empty cylindrical sample holder 104.

Figure 2A:
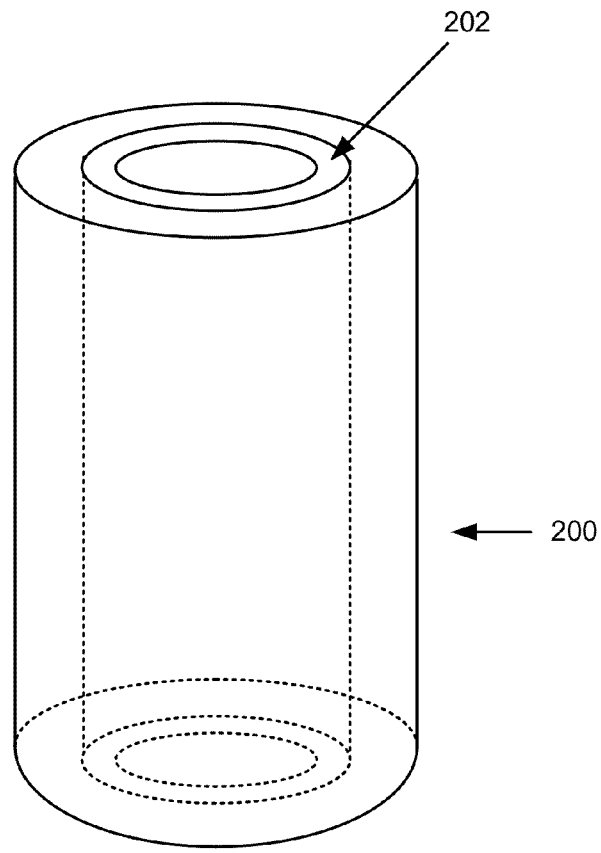
FIG. 2(*a*) illustrates a cylindrical cavity containing an annular sample, according to one or more embodiments of the present invention.
Figure 2B:
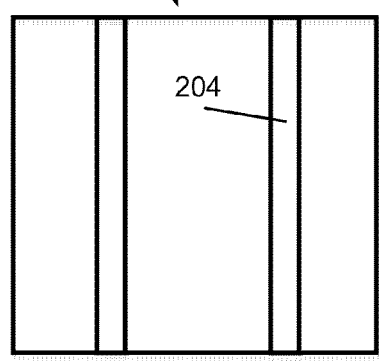
Figure 2C:
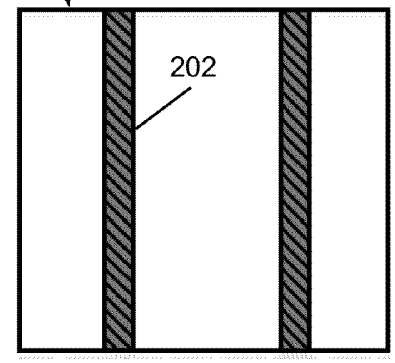

FIG. 2(a) illustrates a cylindrical cavity 200 containing an annular sample 202, FIG. 2(b) is a cross-sectional schematic of the cylindrical cavity 200 containing an empty annulus holder 204, and FIG. 2(c) is a cross-sectional schematic of the cylindrical cavity 200 containing the sample 202 in the cylindrical annulus holder 204.

However, the present invention may be used for more general configurations, comprising multiple materials and regions. For example, in order to perform this analysis, a cylindrical cavity 300 may divided into concentric cylindrical regions 302, 304, and 306 as shown in FIG. 3 (Sphicopoulos et. al., 1984).

Figure 3:
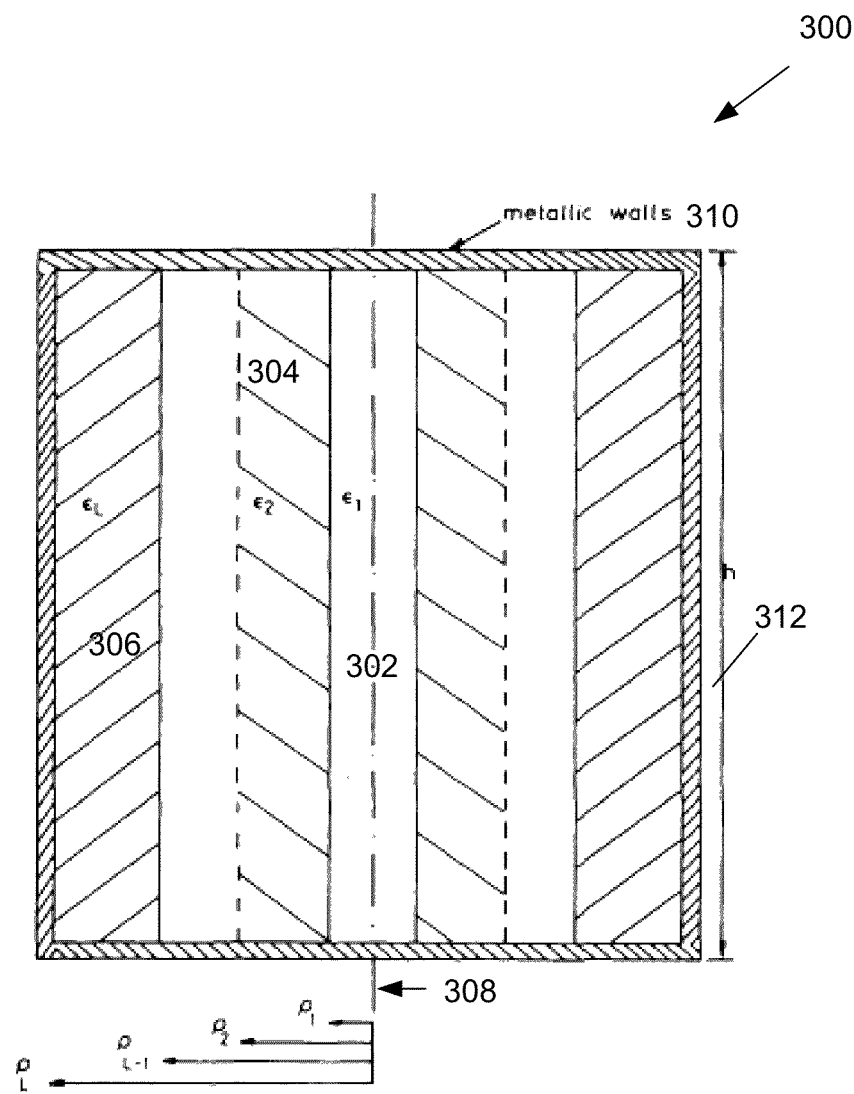
FIG. 3 is a cross-sectional schematic of a cylindrical cavity for the theoretical approach for calculating the complex resonant frequency (Sphicopoulos et. al., 1984), that may be used in one or more embodiments of the present invention.

FIG. 3 illustrates an interior of the cylindrical cavity 300 comprising a set $\{i=1, 2, \ldots N\}$ ("set $\{i\}$") of N concentric cylindrical zones ("the zones") 302, 304, and 306, wherein the zones include a central cylinder 302 and one or more annular regions 304-306 surrounding the central cylinder 302. One or more of the annular regions 304-306 may comprise the sample holder, and the central cylinder 302 may comprise the sample or the vacuum. One of the annular zones (e.g., between the walls and the sample holder), e.g. 306, may comprise vacuum or air. A complex valued dielectric permittivity $\in_i$ assigned for each zone i in the set $\{i\}$ of the N zones, thereby forming a set of complex valued dielectric permittivities $\{\in_i\}=\{\in_i=\in_1, \in_2 \ldots \in_N\}$.

There may be an arbitrary number N or L of concentric regions. Each region 302, 304, 306 may have a different complex dielectric constant $\in_1, \in_2, \in_L$, respectively, and each complex dielectric constant $\in_1, \in_2, \in_L$ may have a known temperature dependence. Given that information, the program (Jackson et al., 1994) may calculate the instantaneous cavity complex resonant frequency at any given temperature as microwaves heat the sample.

The program (Jackson et al., 1994) is valid for essentially any resonant cavity mode and any diameter sample (or concentric materials) situated along the axis 308 of the cavity 300. The outer walls 310 may be metallic walls. The outer walls are typically (but not necessarily) considered boundary conditions rather than regions 302-306. Also shown in FIG. 3 is the radius $\rho_1$ of the cylindrical region 302, the radius $\rho_2$ of the cylindrical region 304, the radius $\rho_{L-1}$ of the cylindrical region 306, and the radius $\rho_L$ of the $L^{th}$ or $N^{th}$ cylindrical region. Also shown is the height or length h 312 of the cavity 300.

This new approach of the present invention may calculate the complex resonant frequency and associated electromagnetic fields for a cylindrical microwave cavity that is loaded with concentric axially aligned lossy dielectric or magnetic cylindrical samples. The actual losses in the walls 310 are estimated from the measured empty cavity quality factor $Q_0$. In this approach, the real (f') and imaginary (f") resonance frequencies $f=f'+jf''$ are related to the experimentally measured quantities by the following expressions:

$$f'=f_s \quad (2)$$

$$f''=f/2Q_s \quad (3)$$

where $f_s$ is the measured resonant frequency, and $Q_s$ is the quality factor associated with the sample only, given by $$Q_s=(1/Q_T-1/Q_0)^{-1}, \quad (4)$$

where $Q_T$ is the loaded cavity quality factor Q.

This calculation assumes known values for the complex dielectric constants of the material(s) in the cavity. However, the present invention is interested in calculating the dielectric constants from the measured cavity frequencies and quality factors, with and without the material(s) inserted. Thus, the present invention developed an inverse program that runs through a range of real and imaginary dielectric or magnetic constants until the present invention obtained the experimental values for $f_s$ and $Q_s$. Since this approach can actually determine the perturbed electromagnetic fields in the cavity with the material(s) inserted, the present invention can recalculate the expected wall losses using the new fields rather, than just depending on the value obtained from the empty cavity quality factor.

Each power sweep through the cavity resonance may be fit to a Lorentzian line shape with an additional linear background frequency term. From this fit, the present invention obtained the resonant frequency, f, and quality factor, Q, for the measured experimental arrangement.

The present invention has modified the program (Jackson et al., 1994) to allow the present invention to probe any range of real and imaginary dielectric or magnetic constants for a sample and surrounding holder, until the present invention obtains the complex dielectric or magnetic constants that give the measured cavity complex resonant frequency, $f_m$, and quality factor, $Q_m$.

Method Steps

Figure 4:
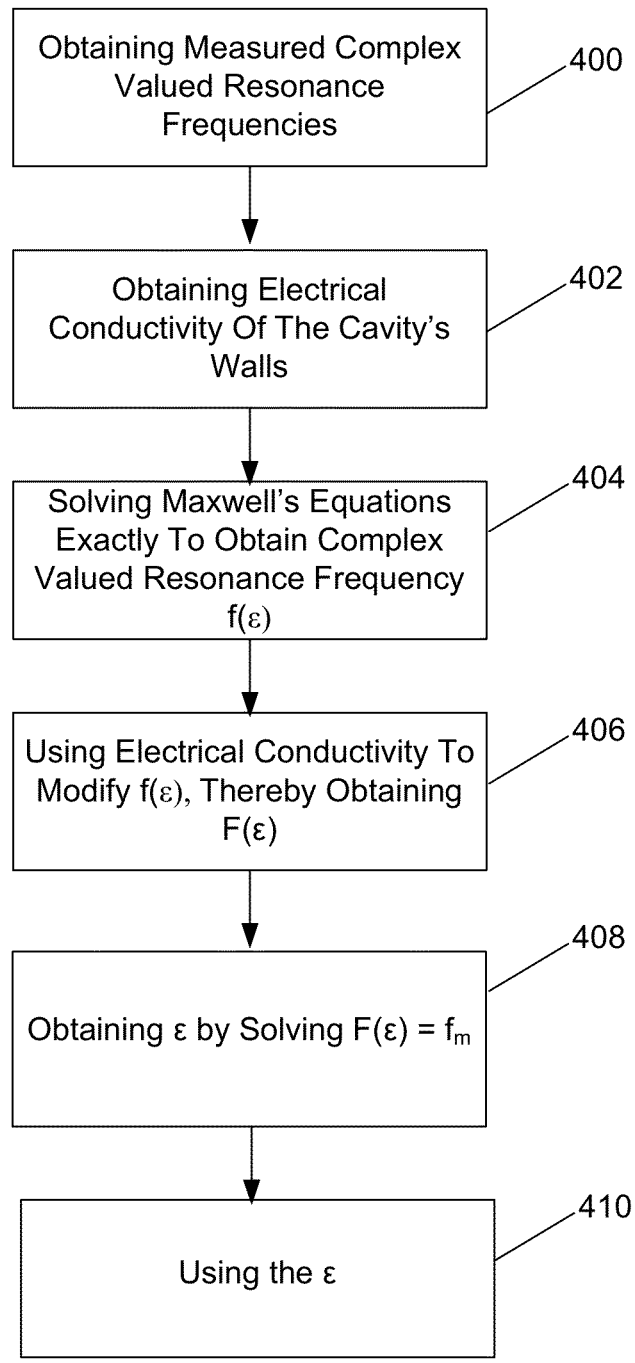
FIG. 4 is a flowchart illustrating a method of obtaining a complex permittivity $\in$ or complex permeability $\mu$ of a sample in a cavity, according to one or more embodiments of the present invention.

FIG. 4 is a flowchart illustrating a method of obtaining a complex valued dielectric permittivity $\in$ of at least one sample. The method may also be used to obtain a complex valued magnetic permeability $\mu$ of at least one sample, by solving for $\mu$ instead of $\in$ in the discussion below. The cavity, the sample holder, and the sample may be cylindrical or annular regions, however, any cavity, sample, or sample holder that has symmetry allowing an exact solution of Maxwell's equations may be used. The sample may be large enough to perturb cavity modes of the cavity. The method may be performed for the sample in the cavity, with or without a sample holder.

The method may comprise the following steps.

Block 400 represents obtaining (e.g., measuring) one or more complex-valued resonance frequencies ($f_m$) and quality factors ($Q_m$) of the cavity, wherein each $f_m$ is a measurement. The Re($f_m$) may be the measured cavity resonant frequency, and the Im($f_m$) may be related to the measured cavity quality factor $Q_m$ by Im($f_m$)=Re($f_m$)/2$Q_m$.

The step may comprise obtaining (e.g., measuring) at least one of the $f_m$ that is a measurement of a complex-valued resonance frequency ($f_{cavity}$) of the cavity when empty, obtaining (e.g., measuring) at least one of the $f_m$ that is a measurement of a complex-valued resonance frequency ($f_{holder}$) of the cavity containing a sample holder, wherein the sample holder is without a sample or contains a vacuum, and obtaining (e.g., measuring) at least one of the $f_m$ that is a measurement of a complex-valued resonance frequency ($f_{sample}$) of the cavity containing the sample in the sample holder or containing the sample without the sample holder.

The measurements may be obtained by exciting the cavity with one or more cavity resonant modes.

Block 402 represents obtaining an effective electrical conductivity $\sigma_w$ of the cavity's walls, using the $f_{cavity}$. The $\sigma_w$ may be obtained using $f_{cavity}$ and known formulas for the calculated complex valued f of the empty cavity (derived from Wilson et. al, 1949):

$$\sigma_w = [Q_0^2/(\pi\mu_0 f_0)](2+D_c/L)^2/D_c^2 \quad (5)$$

where $Q_0$ is empty cavity quality factor obtained from $f_{cavity}$, $\mu_0$ is the permeability of vacuum, $f_0$ is the empty cavity resonant frequency also obtained from $f_{cavity}$, $D_c$ is the cavity diameter, and L is the cavity length. Thus, the $\sigma_w$ is an experimentally determined electrical conductivity for the actual cavity walls used, because it is based on a measured $f_{cavity}$, and can therefore take into account the real, non-ideal properties of the cavity walls, including holes and other imperfections in the cavity walls.

Block 404 represents solving Maxwell's equations exactly (using the method of (Sphicopoulos et. al., 1984) for a complex valued resonance frequency f of the cavity including the sample, wherein the $f=f(\in, \mu)$ is a function of the $\in$ and/or $\mu$ of the sample. Alternatively, the Maxwell's equations may be solved for the sample in the cavity and in a sample holder, so that $f=f(\in, \mu, \in_{holder})$ is a function of both the $\in$ (and/or $\mu$ of the sample) and the complex valued dielectric permittivity $\in_{holder}$ of the sample holder. The step may further comprise solving the Maxwell's equations for a complex-valued resonance frequency g of the cavity including the sample holder without the sample, wherein the $g=g(\in_{holder})$ is a function of the $\in_{holder}$.

More generally, the step may comprise solving the Maxwell's equations (Sphicopoulos et al., 1984) for a complex valued resonance frequency $f(\{\in_i, \mu_i\})$, where a complex valued dielectric permittivity $\in_i$ and is $\mu_i$ assigned for each zone i in a set $\{i=1, 2, \ldots N\}$ of annular regions and a central cylinder, the set of zones $\{i\}$ comprising the interior of the cylindrical cavity. The $f(\{\in_i, \mu_i\})$ is a single frequency for the whole cavity that is a function of every $\in_i$ and/or $\mu_i$ in the cylinder. If there are no magnetic materials in the cavity, then $f(\{\in_i\})$.

Regions in the cavity that are air or vacuum may use the known complex valued permittivity for air or vacuum. For example, the complex permittivity for a vacuum has a real part equal to one and an imaginary part equal to zero.

Block 406 represents using the $\sigma_w$ to modify the f to account for the power absorbed by the cavity's walls, thereby obtaining a resultant complex valued resonant frequency F that is a function of the $\in$ and/or $\mu$. The step may further comprise modifying the g to account for the $\sigma_w$, thereby obtaining a resultant complex-valued resonant frequency G that is a function of the $\in_{holder}$.

More generally, the step may further comprise modifying the $f(\{\in_i, \mu_i\})$ to account for the power absorbed by the cavity's walls, thereby obtaining a resultant complex-valued resonant frequency F. In the general case, the modifying may comprise the following steps.

(1) Calculating a surface resistance $R_s$ formula (e.g., p. 32, equation 1.125 of (Pozar, $3^{rd}$ Edition)):

$$R_s = [(\pi\mu_0 Re[f_t])/\sigma_w]^{1/2} \quad (6)$$

where $f_t = f(\{\in_i, \mu_i\})$ is the theoretical resonant frequency.

(2) Using $R_s$ to obtain the power absorbed by the cavity's walls, $P_{wall}$ (see e.g., (Pozar, $3^{rd}$ Edition), page 33, equation 1.131):

$$P_{wall} = P^t = (R_s/2)\int_S |H_t|^2 ds \quad (7)$$

where t represents the tangential component of the magnetic field at the surface of the cavity walls, $P^t$ indicates the total power absorbed by the total surface area of the cavity walls, $\int_S$ indicates an integral over the surface of the cavity walls, ds is the surface element, and $H_t$ is the magnetic field tangential component at the surface of the cavity walls. Thus, the energy loss in the cavity walls $P_{wall}$ depends on the $R_s$ and the magnetic field strength evaluated at the cavity wall for the calculated magnetic field corresponding to the frequency $f(\{\in_i, \mu_i\})$. The cavity wall quality factor $Q_{wall}$ can then be determined from $P_{wall}$ using $Q_{wall} = 2\pi \, Re(f(\{\in_i, \mu_i\})) \, U/P_{wall}$ where U is the total electromagnetic energy stored in the cavity (see e.g., (Pozar, $3^{rd}$ Edition), page 268, equation 6.7).

(4) Obtaining the contribution $f_{wall} = Re(f\{\in_i, \mu_i\})/2 Q_{wall}$ to the imaginary part of the resultant complex-valued resonance frequency, so that the resultant complex valued resonance frequency $F(\{\in_i, \mu_i\}) = f(\{\in_i, \mu_i\}) + jf_{wall}$. If there are no magnetic materials in the cavity, then $F(\{\in_i\})$.

Thus, F and f may be a function of $\in$ (sample with no sample holder), or $\in$ and $\in_{holder}$ (sample with sample holder). F and f may be a function of the sample's $\mu$ if the sample is magnetic.

Block 408 represents obtaining the $\in$ (or $\mu$) and $\in_{holder}$ by solving $F=f_{sample}$, $G=f_{holder}$, respectively, or more generally by solving $F(\{\in_i, \mu_i\}) = f_{holder}$ and $F(\{\in_i, \mu_i\}) = f_{sample}$. The model may choose different values for the only unknown $\in_1$, to obtain a theoretical F to compare to the experimental value $f_{sample}$, to see which value of $\in_i$ gives a match to any desired degree of precision. For example, the step may comprise obtaining a range of values for the $\in$; and selecting the value in the range that satisfies $F=f_{sample}$ to any desired degree of precision. The solving may be performed numerically, or analytically, for example.

The cavity may comprise one or more additional materials (e.g., sample holder, vacuum, air, etc.) having known material dielectric permittivity and known material magnetic permeability, such that the $\in$ is an only unknown during the solving step. In this regard, the method may first obtain the dielectric properties of the unknown materials in the cavity. For example, the present invention may obtain the $\in_{holder}$ by solving $G=f_{holder}$; and then solve of $F=f_{sample}$ for the sample inserted in the sample holder, using the $\in_{holder}$ obtained by the solving of $G=f_{holder}$.

Thus, more generally, the step may comprise obtaining the complex-valued dielectric permittivity of an empty sample holder $\in_{holder}$ in a zone i=I, or in two non-adjacent zones I and K occupied by the holder, where the dielectric permittivity $\in_i$ (and $\mu_i$ if necessary) for each of the other zones in the set $\{i\}$ is known, by solving $F(\{\in_i, \mu_i\}) = f_m$, where $f_m$ is the complex-valued resonance frequency for the cavity containing an empty sample holder.

The step may then further comprise obtaining the complex-valued dielectric permittivity $\in$ or $\mu$ of a sample, in a zone i=J, contained in a sample holder, where the complex-valued permittivity $\in_i$ (and $\mu_i$ if necessary) for each of the other zones in the set $\{i\}$ is known, by solving $F(\{\in_i, \mu_i\}) = f_m$, where $f_m$ is the complex-valued resonance frequency for the cavity containing a sample in a sample holder. The $\in_{holder}$ solved in the previous paragraph may be used as one of the known $\in_i$.

Thus, Blocks 404-408 above represent solving Maxwell's equations exactly for $\in$ and/or $\mu$ and/or $\in_{holder}$ using the $f_m$ as known quantities, thereby obtaining the $\in$ and/or $\mu$ of the sample and/or $\in_{holder}$ of the sample holder. The method of the present invention may comprise exciting the cavity, measuring quality factors and resonant frequencies to obtain the experimental complex resonant frequency f of the cavity, solving Maxwell's equations for the theoretical complex resonant frequency F, and obtaining $\in$ and/or $\mu$ by equating the theoretical complex resonant frequency F to the measured complex resonant frequency f.

The present invention allows for exploring any range of the unknown complex $\in$ or to determine the value that satisfies F=f to any degree of precision desired.

Block 410 represents using the $\in$ or $\mu$ to interpret remote sensing data obtained from earth or extra-terrestrial material, thereby identifying one or more compositions, optical properties, or dimensions of the material; and transmitting, storing, or displaying the compositions, optical properties, or dimensions of the material (Janssen et al., 2008). This invention could also support data interpretation from future flight missions including SMAP (Soil Moisture Active & Passive) (1.2-1.4 GHz), and DESDynI (Deformation, Ecosystem Structure and Dynamics of Ice) (1.2 GHz).

However, the present invention is not limited to providing $\in$ or $\mu$ for any one particular application. The method of the present invention can be used to provides or $\mu$ for any application.

In general, the present invention solves for one unknown at a time. For the case of non-magnetic materials in the cavity, the functions f and F are not a function of $\mu$ In the case of magnetic materials in the cavity, the permeability of the materials in the cavity will have to be known. The sample's permeability $\mu$ can be determined using the method of the present invention once the sample's permittivity is known, as further discussed below.

Obtaining Magnetic Permeability

Figure 5:
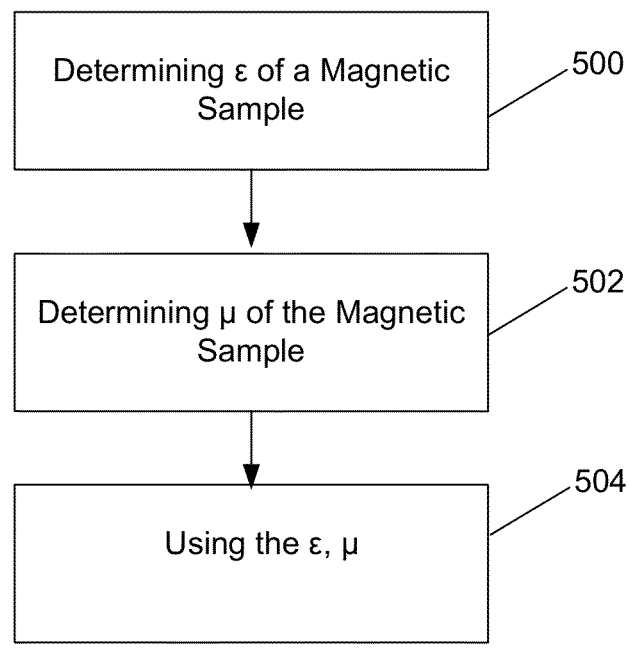
FIG. 5 is a flowchart illustrating a method of obtaining a complex permittivity $\in$ or complex permeability $\mu$ of a magnetic sample, according to one or more embodiments of the present invention.

A similar method may be used to measure magnetic permeability, as illustrated in FIG. 5. The present description given above may make accurate permittivity measurements on essentially any size non-magnetic materials.

However, even if the sample is magnetic, the permittivity may be determined by placing a small cylindrical sample and holder along the axis of a cylindrical cavity where the magnetic field is close to zero.

For example, Block 500 of FIG. 5 represents determining the $\in$ of a magnetic sample. The step may comprise using a cavity resonant mode that is at least one Transverse Magnetic (TM$_{0n0}$) mode. The step may further comprise performing the steps of Blocks 400-408 in FIG. 4 for the sample that is a first cylindrical sample positioned along the cavity's axis, the first cylindrical sample having a first radius 106 that is sufficiently small so that the magnetic field's strength (produced by the cavity resonant mode) at the first radius' end 108 is negligible (see also FIG. 1(a)), thereby allowing the Maxwell's equations and the F to be solved for only one unknown, the $\in$.

The present invention may also measure the permeability of samples. The permeability can be determined by first using a thin sample to obtain the complex dielectric constant as mentioned above (e.g., using the first cylindrical sample). Then a larger diameter sample (second cylindrical sample) is used so it sees both a magnetic and electric field produced by the cavity resonant mode. Knowing the dielectric constant, the present invention can then back out the permeability.

Block 502 represents determining the $\mu$ of a magnetic sample. The step may comprise performing the steps of Blocks 400-408 in FIG. 4, using the sample that is the second cylinder comprising a same material as the first cylinder, and having a larger radius than the first radius, such that the second cylinder positioned along the axis experiences both the magnetic field and the electric field, thereby allowing the Maxwell's equations and the F to be solved for only one unknown, the $\mu$, using the $\in$ obtained using Block 410.

With this approach there may be a slight shift in the resonant frequency between the small and large samples. With a proper design of the cavity, these permittivity and permeability measurements may be made for at least the three lowest resonant frequencies (TM$_{010}$, TM$_{020}$, and TM$_{030}$).

The present invention further discloses a second method for measuring the permeability of a sample, where only one sample is required. In this case, the cavity resonant modes may comprise a first frequency, a first magnetic field, and a first electric field associated with a first TM$_{0n0}$ mode, where n is an integer. The cavity resonant modes may further comprise a second frequency, a second magnetic field and a second electric field associated with a second TM$_{0n0}$ mode, wherein the first frequency and the second frequency such that the $\in$ and the $\mu$ at the first frequency are negligibly different from the $\in$ and the $\mu$ at the second frequency.

In this case, Block 500 represents (1) exciting the cavity with the first TM$_{0n0}$ mode where the sample is an annulus positioned, placed, or located at a radius value of the cavity associated with a maximum of the first electric field and a zero of the first magnetic field (where the magnetic field is zero); and (2) performing the steps of Blocks 400-408 in FIG. 4 using the first TM$_{0n0}$ mode, thereby allowing the Maxwell's equations and the F to be solved for only one unknown, the $\in$.

Block 502 then represents performing the steps of Blocks 400-408 in FIG. 4 using the second TM$_{0n0}$ mode so that the sample experiences both the second electric field and the second magnetic field, thereby allowing the Maxwell's equations and the F to be solved for only one unknown, the $\mu$, using the $\in$ obtained using the first TM$_{0n0}$ mode.

In one example, the first TM mode is a TM$_{020}$ mode, measurements for this TM$_{020}$ mode may determine the permittivity, and the second TM mode is a TM$_{010}$ mode that allows the same sample to be in both magnetic and electric fields, thereby allowing the present invention to back out the permeability knowing the permittivity obtained using the TM$_{020}$ mode. The annular sample may a solid, or a liquid or powder in an annular holder, for example.

The present invention has developed Mathematical programs for calculating the permittivity and permeability using this technique. These programs are able to determine the changes in the electromagnetic field at the cavity wall from its empty cavity and loaded cavity states. This ability goes beyond the previous perturbation approaches.

Block 504 represents using the $\mu$, $\in$.

Rootfinder Method For Solving $F(\{\in_i, \mu_i\})-f_m=0$

A highly efficient rootfinder that may be used to solve an equation such as $F(\{\in_i, \mu_i\})-f_m=0$ for a complex valued dielectric permittivity $\in_I$ or complex valued dielectric permeability $\mu_I$ has been developed and is described below. This rootfinder may be applied to a large variety of problems.

One or more solutions of the equation C(z)=0, where C=Re C+j Im C and z=Re z+j Im z, can be obtained as intersection points of two lines that lie in the complex z-plane. The coordinate axes in that plane are labeled Re z and Im z. The two null, or zero, lines that intersect can be determined by the conditions Re C(z)=0, Im C(z)=0. The procedure for locating the one or more solutions of C(z)=0 may be made highly efficient by first obtaining approximate solutions with a minimum of calculation. Only then are complicated quantities evaluated that accurately locate the solution or solutions.

Figure 6:
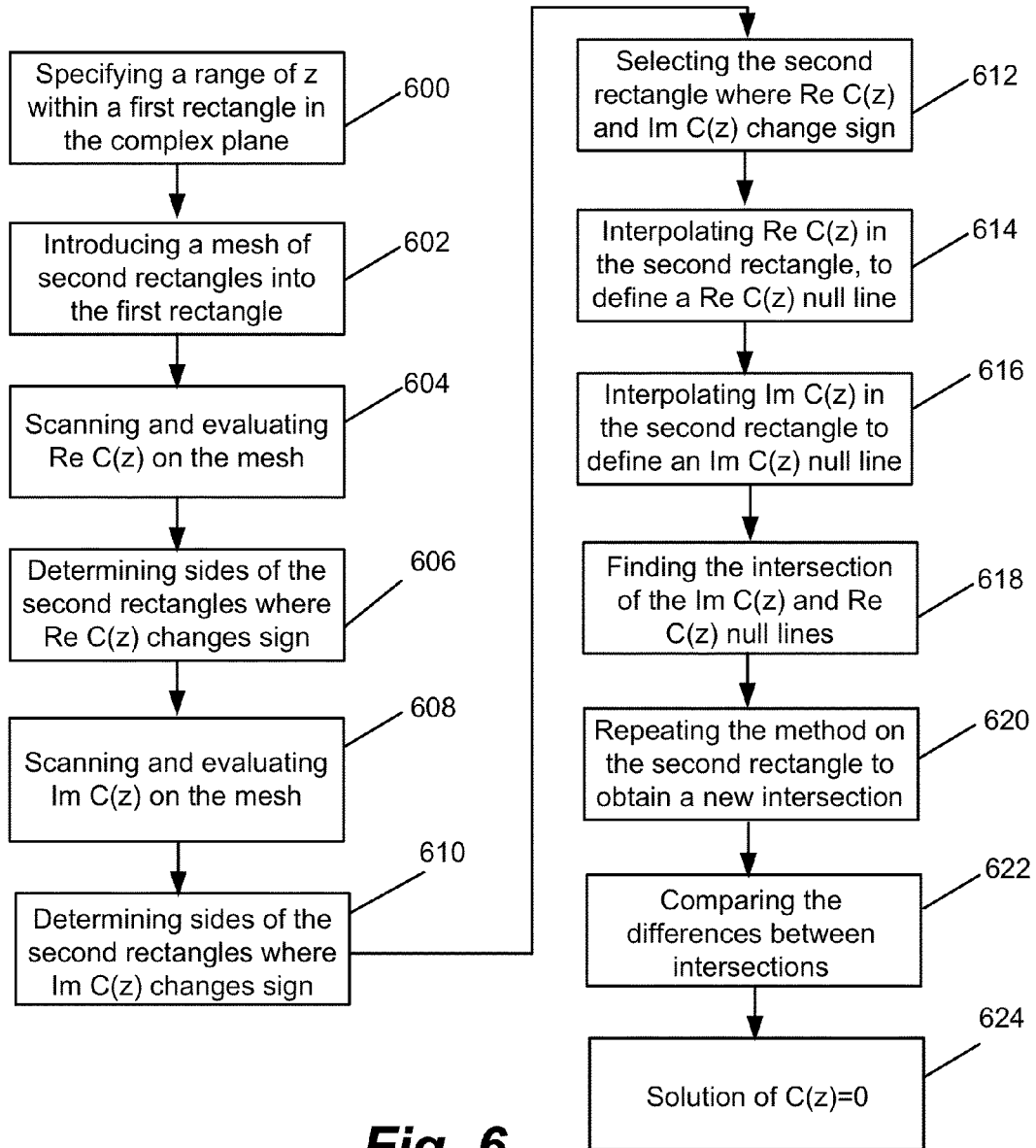
FIG. 6 is a flowchart illustrating a rootfinder method according to one or more embodiments of the present invention.
Figure 7:
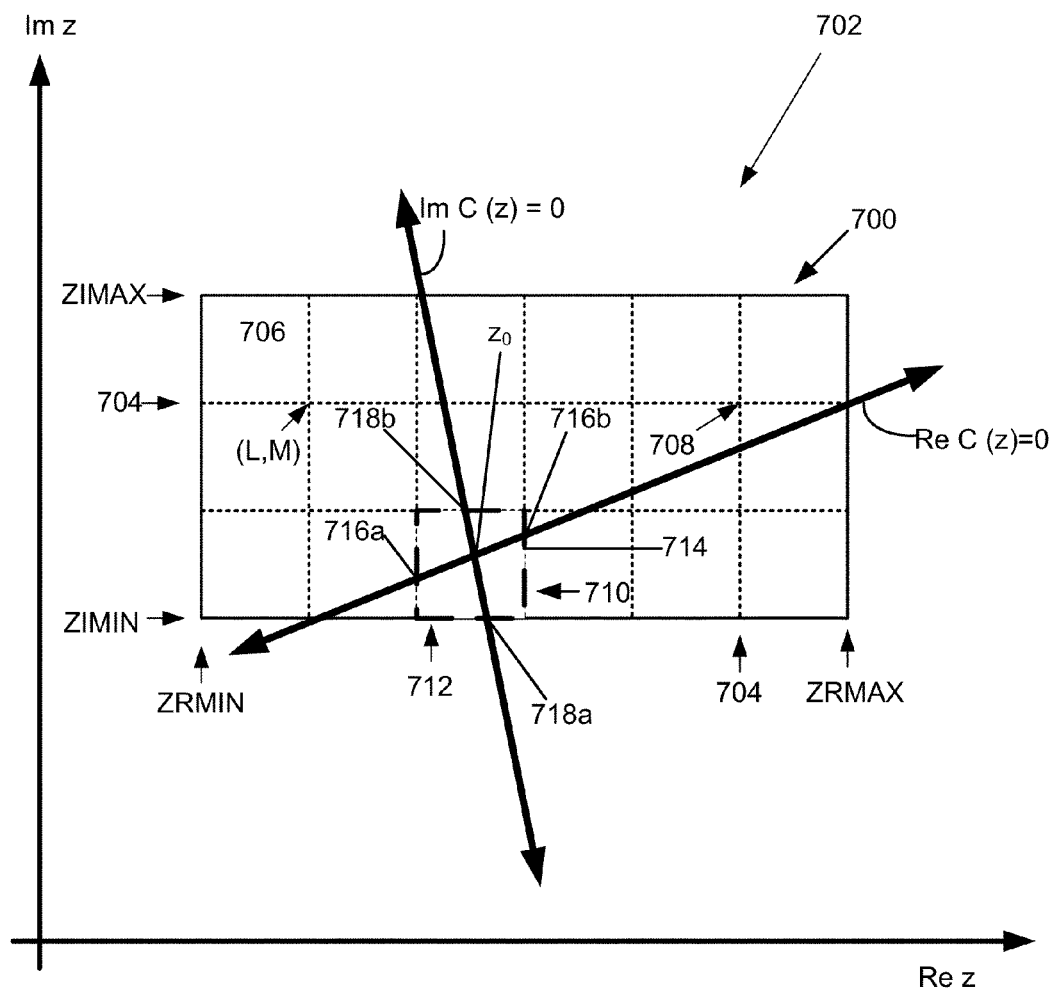
FIG. 7 is a schematic illustrating a mesh on the complex plane, according to one or more embodiments of the rootfinder method illustrated in FIG. 6.

FIG. 6 is a flowchart illustrating the rootfinder method. FIG. 7 illustrates a mesh in the complex plane used in the method.

The first step in the procedure, represented in Block 600, is to specify a range of values of z, within a rectangle 700 in the complex z-plane 702, that is to be searched for solutions of C(z)=0. The rectangle 700 is specified to be the region having coordinates along the Re z axis between ZRMIN and ZRMAX, and coordinates along the Im z axis between ZIMIN and ZIMAX.

Next a mesh is introduced in this rectangle, as illustrated in Block 602, the mesh having NR equal intervals 704 between ZRMIN and ZRMAX, and NI equal intervals between ZIMIN and ZIMAX. Each small rectangle 706 in the mesh will be associated with the indices (L, M) that locate its lower left-hand corner.

Block 604 represents scanning and evaluating Re C(z) on the mesh. Start at L=1, M=1, scan from left to right, and then move upward to the next row and scan from left to right. Repeat this procedure until the entire large rectangle has been scanned. Evaluate the function Re C(z) at each corner of each rectangle 706 in the mesh, i.e. at each mesh point 708. Then return to L=1, M=1 and scan again in the same manner, but also determine sides 710 of the small rectangles 706 in the mesh such that Re C(z) changes sign there, as represented in Block 606. For each rectangle (L, M) assign the value 0 or 2 to a function JR(L,M) according to whether there are zero or two sides 710 of the rectangle 706 where Re C(z) changes sign.

A similar procedure is carried out for Im C(z)=0, as illustrated in Blocks 608 and 610, but now assign the value 0 or 2 to a function JI(L, M) according to whether there are zero or two sides 712 of the small rectangle 706 where Im C(z) changes sign.

The next step, represented in Block 612, is to scan the large rectangle 700 and select for further processing each small rectangle 714 (thick dashed rectangle in FIG. 7) where JR(L, M)=2 and JI(L, M)=2. Any point z within or on the boundary of such a rectangle (L, M) 714 is an approximate solution of C(z)=0. However a more accurate solution can be obtained by the following steps.

In each rectangle (L, M) 714 that satisfies the conditions specified, points 716a, 716b on the sides 710, 712 of the rectangle 714 such that Re C(z)=0 can be obtained to good approximation by linear interpolation of values of Re C(z) on the corners of the rectangle 714, as represented in Block 614. The two null points 716a, 716b on sides of the rectangle (L, M) 714 define a straight null line segment for the function Re C(z). This line segment lies in the rectangle (L, M) 714.

For that same (L, M) rectangle 714, points 718a, 718b on the sides of the rectangle such that to good approximation Im C(z)=0 can be obtained by linear interpolation of Im G(z) on the corners of the rectangle (Block 616). Those two null points 718a, 718b define a straight null line segment for the function Im C(z). That line segment lies in the rectangle (L, M) 714.

The intersection point $z_0$ of the two straight null lines inside the rectangle (L, M) 714 can be found by simple algebra, as represented in Block 618. The value of $z_0$ is a better approximate solution of C(z)=0.

The entire procedure of Blocks 600-618 is then repeated, as represented in Block 620, by further partitioning the above rectangle (L, M) 714 with a smaller mesh size and determining a new intersection point, which will now be called $z_1$.

The difference [Re ($z_1$)–Re ($z_0$)] and the difference [Im ($z_1$)–Im ($z_0$)] are now individually compared with a specified precision parameter, as represented in Block 622. If each of these differences meets the specified precision criterion, then $z_1$ will be taken as the solution of C(z)=0. If the precision criterion is not met, then this procedure is repeated with successively smaller rectangles covered by successively finer meshes until the specified precision criterion is met by two successive calculations.

Block 624 represents the final value for the intersection point, now called $z_f$, is a solution of C(z)=0 that meets the precision that has been specified. Application of this procedure an infinite number of times will converge to an exact solution of C(z)=0.

Thus, as applied to the solving of $F=f_{sample}$, the method of the present invention may further comprise finding roots of $F-f_{sample}=0$, by:

(i) specifying a range of values for z within a first rectangle in a complex plane, wherein the z are complex numbers in a complex plane (Block 600);

(ii) introducing a mesh of second rectangles into the first rectangle, thereby forming the mesh comprising mesh points at corners of second rectangles, wherein the second rectangles are smaller than the first rectangles (Block 602);

(iii) scanning and evaluating Re F(z) on the mesh at each of the mesh points (Block 604);

(iv) determining one or more first sides of the second rectangles where the Re (F(z)) changes sign (Block 606);

(v) scanning evaluating Im F(z) at each of the mesh points (Block 608);

(vi) determining one or more second sides of the second rectangles where the Im F(∈) changes sign (Block 610);

(vii) selecting the second rectangles having both the first sides and second sides, where both the Re F(z) and the Im F(z) change sign, to obtain selected second rectangles (Block 612);

(viii) interpolating the Re F(z) in the selected second rectangles to define a Re F(z) null line (Re C(z)=Re F(z)=0) (Block 614);

(ix) interpolating the Im F(z) in the selected second rectangles to define an Im F(z) null line (Im C(z)=Im F(z)=0) (Block 616);

(x) finding a first intersection point between the Re F(z) null line and the Im F(z) null line (Block 618);

(xi) setting the second rectangle as the first rectangle and repeating steps (i)-(x) using the second rectangle as the first rectangle, thereby finding a new or second intersection point (Block 622);

(xii) obtaining a difference between the first intersection point and the second intersection point, and comparing the difference with a precision parameter that is equal to a desired precision (Block 622);

(xiii) repeating the method until the difference is at least as small as the precision parameter, thereby obtaining a final intersection point;

(xiv) setting the final intersection point equal to the property (Block 624).

Steps may be omitted or added as desired.

Experimental Results

Polyvinyl Chloride (PVC) Rod Samples

In one embodiment, the present invention used an existing microwave cavity (3" long cylindrical cavity) designed to excite the $TM_{010}$ resonant mode with a resonant frequency of 2.45 GHz (using equation (1), the $TM_{0n0}$ mode has $f_{010}$=2.452 GHz). The test samples were Polyvinyl Chloride (PVC) rods, some of which were enclosed in a Polycarbonate (PC) tube. The present invention performed dielectric property measurements on various sized PVC rods (Type 1 PVC solid rods of ¼" diameter and ⅜" diameter, simulating e.g., the sample), either alone or enclosed in the PC tube (used, e.g. as the sample holder). A ⅜" outer diameter (OD)×1/16" wall PC tube was used as the holder for the smaller ¼" diameter PVC rod (that could also simulate a liquid contained in the holder).

These measurements should give the same values for the PVC real and imaginary dielectric constants for both PVC rods.

The present invention was careful regarding the way energy is transmitted into and out of the cavity. The cavity was excited using a small loop antenna positioned to couple to the $TM_{010}$ mode magnetic field. The energy in the cavity was detected using a similar small loop antenna situated on the sidewall. The approach taken by the present invention was to weakly couple the microwave energy into the cavity. This was accomplished by designing a special support for a rotatable rod attached to the loop antenna. The rod was rotated so that the excitation loop area barely coupled to the magnetic field lines associated with the $TM_{010}$ mode. This approach requires a much larger drive signal, since ~99% of the signal may be reflected back. In this way, a negligible amount of the energy that does enter the cavity may leak back out through the weakly coupled exciter or detector loops, and cause an error in the quality factor (Q) measurement.

An Agilent Technologies E8364B Vector Network Analyzer (VNA) was used to sweep the frequency through the resonance. With the exceptional signal to noise characteristics of this unit, only 8 mW of drive power was needed to obtain measurable signals.

First the empty cavity resonant frequency and quality factor were measured. These empty cavity measurements were needed because the cavity walls absorb microwave energy in addition to the sample and a correction for this additional energy loss needed to be taken into account.

Then, the sample of interest was inserted, and the loaded sample cavity frequency and quality factor were measured. For the case of the ¼" diameter PVC rod inserted into the PC tube, the PC tube complex dielectric constant was first determined by inserting this tube into the cavity separately, and making the frequency and quality factor measurements for the tube alone. Then, knowing the dielectric properties of the tube, the present invention repeated the measurements with the PVC rod inserted in the PC tube. The present invention also separately performed cavity measurements on the larger ⅜" OD PVC rod.

Each power sweep through the cavity resonance may be fit to a Lorentzian line shape with an additional linear background frequency term. From the fit, the present invention obtained the resonant frequency, $f_0=2.38071e+09+/-12$ Hz, and quality factor, $Q_0=1414.27+/-0.03$, for one example of a measured experimental arrangement.

These sets of measurements were used to determine the dielectric properties of the two different sized PVC rods using various calculation methods (cavity perturbation and the present invention). The validation of the new technique of the present invention depended on the measured values of the two PVC rods being consistent with each other.

The difference in the real and imaginary dielectric constants between the two PVC rods was 3.6% and 1.1%, respectively, using the approach of the present invention. These results confirmed the validity of the present invention's new technique. The resultant deviations were partially due to the slight non-uniformity in the PVC rods, the fact that there was a slight gap between the ¼" PVC rod inserted in the PC tube.

Ice Samples

This technique was also validated for a solid ice sample enclosed in a container at lower temperatures.

Additional measurements were made on pure water ice samples at −20° C. and −38° C. For the real part of the dielectric constant at these temperatures, the present invention obtained 2.91 and 2.99 respectively. The only other reliable measured values of the real part of the dielectric constant in the present invention's frequency and temperature ranges (0.15 to 2.5 GHz, −1 to −60° C.) have been obtained by Westphal (Ulaby), and are in the range 2.90-2.95. These values by Westphal are in excellent agreement with the present invention's measurements at −20.3° C. and −38.0° C.

However, a comparison of the present invention's imaginary dielectric constant measurements of pure water ice was difficult because there is substantial scatter in the previously published studies (Ulaby et. al, 1986). Westphal (c.f. Warren et al., 1985) noticed that annealing ice samples for a few hours at −10° C. resulted in lower losses, and used this technique for making the ice measurements. However, even with this approach, Westphal estimated the accuracy in measuring the imaginary dielectric constant to be ~±20%.

The present invention always cooled the cavity as quickly as possible to the target low temperatures. However, because of Westphal's uncertainties, the present invention was not able to make a meaningful comparison of the present invention's imaginary dielectric constant with literature values. Nevertheless, the results of the present invention's initial study of PVC and ice samples gives confidence in using the present invention's new approach for performing further cryogenic measurements on liquid methane and ethane.

Condensed Liquefied And Cryogenic Samples

One of the motivations for developing this invention was to be able to perform accurate dielectric measurements on cryogenic liquids, such as methane and ethane. These are materials assumed to be components in lakes on Titan, a moon of Saturn. The Cassini spacecraft has been taking radar measurements of Titan's lake at a frequency of 13.78 GHz. In the past, the "free-space," "resonant-cavity," "capacitive," and "calorimetric" methods (Whiffen, 1950; Lorenz, 1999; Lorenz and Shandera, 2001; Lorenz et al., 2003; Paillou et al., 2008; Paillou et al., 2008a) have been used to measure the complex dielectric constant of some Titan-relevant materials. Some of the early studies were performed at lower frequencies, near room temperature and were not very accurate (Whiffen, 1950; Lorenz and Shandera, 2001; Lorenz et al., 2003). More recent studies by Paillou and co-workers (Paillou et al., 2008; Paillou et al., 2008a), working in the microwave region, have used the free-space method (Ghodgaonkar, et al., 1989) to measure the complex dielectric constant of cryogenic liquids and the resonant-cavity method to measure solids. The more accurate of these earlier resonant-cavity studies have used a form of the cavity perturbation to extract the dielectric constants from their microwave measurements (Vaid et al., 1979; Rodriguez et al., 2003). The present invention has fabricated a cylindrical microwave cavity designed to excite the $TM_{0n0}$ modes in order to perform these cryogenic microwave measurements. By making the cavity length small, the higher order unwanted modes are moved to higher frequencies, allowing the first three $TM_{0n0}$ modes to be unperturbed.

The radius for an empty cavity tuned to have a $TM_{020}$ resonant frequency at 13.78 GHz is a ~1.91 cm. However, when a quartz tube used as a sample holder is inserted in the cavity, the resonant frequency may be lowered. For the resonant frequency to be at 13.78 GHz when a thin-walled quartz tube filled with liquid methane is inserted, the present invention estimates the cavity radius to be ~1.65 cm.

Figure 8:
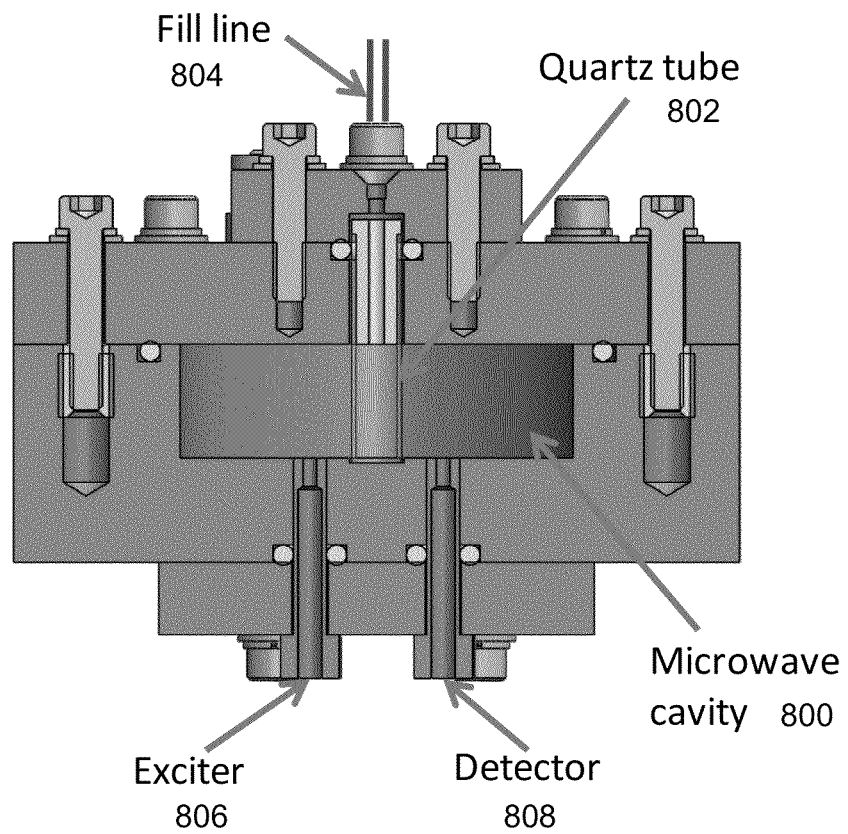
FIG. 8 is a cross-sectional drawing of a microwave cavity, according to one or more embodiments of the present invention.

A drawing of the custom microwave resonant microwave cavity 800 fabricated for measuring condensed liquids is shown in FIG. 8. The cavity is sealed to eliminate water condensation. The cavity may be first evacuated and then filled with a small amount of transfer gas to provide good thermal contact between the quartz tube 802 and cavity's 800 copper walls. The quartz tube 802 may be moved in and out of the cavity 800 and may be sealed by a Teflon O-ring. A gas handling system may be used to allow pure hydrocarbons or their mixtures (such as methane and ethane) to be prepared and condensed through a capillary fill line 804 into the quartz tube 802 at cryogenic temperatures. A pressure gauge may measure the pressure in the transfer line. Once liquid forms, the measured pressure corresponds to the vapor pressure, which is a function of the interface temperature. The experimenter knows when the quartz tube 802 is filled, since at that time, the gas-liquid interface may move up the warmer fill line 804, where a higher vapor pressure may be measured. Also shown is the exciter 806 (wherein exciting radiation is inputted) and the detector 408 (for detecting the resonance frequency and Q factor, e.g., with a loop antenna)

A larger microwave cavity having the same design as shown in FIG. 8 may be fabricated to operate at 2.38 GHz. This new cavity may be used to study solid icy compositions relevant to understanding the surface behavior of Saturn's airless icy satellites. A different quartz tube design may be needed when solid samples are to be initially inserted into the quartz tube and measured. These solid samples may be characterized, before and after their dielectric properties are measured, using a cryogenic polarizing microscope, and low temperature scanning electron microscope with an X-ray Energy Dispersive Spectrometer (EDS).

A cryogenic facility may be constructed to provide precision temperature control of the disk-shaped microwave cavity. The cavity may be supported inside a dewar using thin walled stainless steel (SS) tubes. The dewar may be filled with liquid nitrogen to a level below the cavity. A long copper rod or finger may extend to near the bottom of the dewar to act as a cooling link to the cavity. A stainless steel insert, inserted between the copper rod and cavity may act as a thermal impedance. With this design, the cooling power to the cavity should remain rather constant, even as the liquid nitrogen level is reduced. The cavity may have a heater and thermometer, and the cavity temperature may be controlled using a proportional, integral, differential (PID) controller. The temperature of the cavity may have a stability better than 0.01° C. The cavity can be easily detached as a module if there is a need to insert a solid sample into the quartz tube. The temperature controllers and vacuum pumps needed for this cryogenic system may also be provided, as well as a VNA (such as an HP 8510C VNA) for measuring the resonant shape.

There are three steps in the procedure for performing measurements. First, the resonant frequency and quality factor of the empty cavity may be measured over the temperature range of interest. This is needed to determine the temperature dependence of the cavity wall electrical conductivity, from which the present invention can obtain the absorption behavior of the cavity walls. Then, the empty quartz tube may be inserted into the cavity and the measurements repeated. With these two sets of initial measurements, the present invention may calculate the complex dielectric constant of the quartz tube over the measured temperature range. Then, the final set of measurements may be made with the sample and quartz tube inserted. With these data sets, the present invention may calculate the complex dielectric constant of the sample over the entire temperature range of interest.

Error Analysis

The absolute accuracy in the calculated dielectric constants primarily depends on the accuracy in (1) the measurement of the microwave cavity and quartz tube dimensions, (2) the measurement of the shift in the cavity resonant frequency and quality factor when the sample is inserted, and (3) the calculation method. The microwave cavity and quartz tube dimensions, as well as the frequency shift, can be measured quite accurately. The new calculation method depends on an exact solution of Maxwell's equations for this experimental configuration. However, it assumes perfect boundary conditions. In reality, there can be perturbations in the electromagnetic fields due to no ideal boundary conditions (holes in cavity walls, exciter and detector antennas and etc.) that modify the currents in the cavity walls. These perturbations may be minimized by using a metal coating on the top of the inserted quartz tube that may approximate the expected metal boundary, and may also significantly reduce the leakage of energy out the cavity opening. The present invention may also use specially designed antennas with very small metal loops that approximate the expected boundary.

With regards to determining the complex dielectric constant (where $\in'$ is Re($\in$), $\in''$ is Im($\in$), and the $\in''$ may be determined from the measured quality factor shift), there may be a limitation as to how small a $\in''$ can be determined. For the worst case scenario of a pure methane sample with a small loss tangent of, say $\tan\delta = \in''/\in' = 10^{-5}$, the present invention estimates the shift in the cavity Q, when the sample is inserted, may only be ~0.35%. For an expected initial Q of ~11,300, this corresponds to a shift in Q of ~40. This accuracy may depend on having a good signal to noise sweep measurement, and on how well the measured resonant line shape matches the expected Lorentzian shape. The present invention may be able to measure this low loss tangent to ~5%.

Possible Modifications

The $f_m$ and $Q_m$ may be measured by exciting the cylindrical cavity with a $TM_{0n0}$ mode of microwave radiation, with n such that (but not limited to) 0<n<3. However, the present invention is not limited to a particular excitation frequency.

The cavity may have any size, for example a radius of the cavity may be selected to excite the TM modes for the required frequency range.

The $f_m$ and the $Q_m$ may be measured or obtained as a function of temperature, thereby obtaining $\in$, $\in_{holder}$ as a function of temperature.

Advantages and Improvements

The present invention allows accurate measurements of dielectric permittivity and magnetic permeability of various materials. The real part dielectric permittivity is a measure of the reflectivity of the material, for example, and the imaginary part of the dielectric permittivity is a measure of the absorption of the material, for example.

The present invention uses one or more modes or resonances of a cavity, for the empty cavity and for the cavity containing a sample and/or sample holder. The sample and the sample holder perturb the empty cavity modes and shift the field behavior. The shift depends on the size of the sample. Prior to the present invention, only permittivities for samples having small sizes of the order of a few percent of the cavity's volume could be measured accurately, using a cavity perturbation approach.

Prior to the present invention, attempts to measure the change in Q factor with and without the sample measured only small samples (a few percent of cavity volume), ignored certain errors, and ignored the effect of the sample holder, and used only solid samples.

The present invention, on the other hand, may use a larger sample, and accounts for cases where the fields at the cavity walls are changed due to the presence of the sample, as compared to the empty cavity. Therefore, the present invention may determine the new field at the walls when the sample gets larger. The present invention may also compensate for imperfections (losses) in the cavity walls. The present invention may use a rod of solid or a liquid in a sample holder.

The present invention may solve Maxwell's equations exactly for a cylindrical cavity, containing a sample that is a cylindrical tube, or containing the sample that is a cylindrical tube within the sample holder that is also a cylindrical tube. However, the present invention's cavity may be a cylinder of any size that can be broken up into an arbitrary number of regions or cylinders, e.g., 20, and solve for the behavior in each region. The present invention may monitor the temperature profile inside the sample rod as a function of time, for different materials, thereby obtaining the properties of the sample and sample holder as a function of time and temperature. For example, the present invention may account for the inside of the sample heating before the surface of the sample.

Using the present invention, the permittivity of the sample obtained with and without the sample holder is the same to within a few percent. Therefore, the present invention can more accurately account for the effect of the sample holder on the fields.

The validation of the present invention's new approach opens up opportunities for performing complex dielectric constant measurements on larger sized samples (both solids and liquids and porous materials) that cannot accurately be obtained by other means. An important application of this new approach is the determination of the dielectric properties of candidate liquid hydrocarbon compositions (methane/ethane) that may be the components of the apparent lakes observed on Titan (~90 K). These new measurements may support the interpretation of radar echoes obtained from the Cassini Synthetic Aperture Radar Imager (SAR) operating at 13.8 GHz.

These types of low temperature measurements may require new cavity designs and a better temperature controlled cryogenic chamber. Small disk shaped cylindrical cavities can be designed to excite the first three $TM_{0n0}$ modes without interference from other cavity modes, i.e., $f_{010}$=2 GHz, $f_{020}$=5 GHz, and $f_{030}$=8 GHz. The frequency range from ~1-15 GHz could be covered by using two different sized chambers.

Examples Of Applications

Applications of the present invention described herein are merely provided as examples.

The present invention may perform cryogenic microwave dielectric property measurements to support the interpretation of radar and radiometric observations of Titan and other icy satellites of Saturn. In particular, the present invention may use these measurements to interpret Cassini radiometric and radar observations at 13.78 GHz (2.2 cm) of Titan, and other Saturnian icy satellites obtained by the Cassini RADAR instrument, and available from the Cassini Planetary Data System (PDS) archive, as well as ground-based radar measurements collected on the main airless icy satellites of Saturn at 2.38 GHz (13 cm). New dielectric measurements are essential to constrain the surface and near-surface composition of these bodies.

In one embodiment, there are four main tasks.

(1) Setting up a microwave cavity and cryogenic system for operation at temperatures down to near liquid nitrogen (~80 K). This first microwave cavity may make measurements of complex dielectric properties at ~13.78 GHz (2.2 cm) and have the capability of measuring low loss tangents to a high degree of precision (e.g. down to ~$10^{-5}$ to within ~5%) using the new more accurate analysis model.

(2) Subsequently measuring properties of liquid hydrocarbons relevant to Titan, specifically methane, ethane and their mixtures initially without, and afterwards with impurities (dissolved nitrogen, solid hydrocarbons, etc.).

(3) Applying these results to the analysis of lakes on Titan. The present invention may estimate lake depth observation limits as a function of composition, and RADAR looks and geometry. These dielectric measurements may be used in conjunction with RADAR stereo bathymetric measurements of apparent subsurface intra-lake structures, to (a) test whether these structures are consistent with being observed through volumes of cryogenic liquids, (b) bracket compatible composition ranges using a wide range of dielectric properties measured in the lab, and (c) refine and apply a technique to estimate the depth of subsurface intra-lake structures if viable dielectric properties are in a narrow range.

(4) Performing additional dielectric measurements on solids, mainly various ice mixtures, to support the interpretation of the publicly available microwave radar and radiometry observations of the main Saturnian icy satellites, namely Titan, Mimas, Phoebe, Enceladus, Tethys, Dione, Rhea, Hyperion and Iapetus. For some of these studies, different microwave cavities operating at various frequencies may be fabricated.

Expected Significance

Major objectives of planetary research revolve around understanding the origin and evolution of solar system objects. In particular, the surfaces of the outer icy satellites contain a record of their history. Constraining their composition is necessary to determine the physical or geological endogenic or exogenic processes that have affected their surface, and to determine the state and early evolution of the solar system, since the materials present at the surface of these satellites are those from which the solar system formed.

Radar and radiometry observations can make an important contribution to this effort. However, the interpretation of the accumulating data requires knowledge of the properties of the materials that comprise these surfaces. Existing data is sparse on properties of candidate surface materials at the low temperatures on these satellites, particularly dielectric properties at microwave frequencies. The first part of the proposed effort will fill gaps and close uncertainties in these properties of one of the most important of these, namely, liquid methane-ethane mixtures, thereby enabling more thorough interpretation of data obtained by the Cassini RADAR instrument on the lakes observed on Titan. Additional dielectric property measurements may be performed on ice mixed with various contaminants (ammonia, silicate, organics, etc.) and organic compounds, at temperatures relevant to the main icy satellites of Saturn (~60-100 K) and at other frequencies. Most of these measurements will be totally new and are critical to better understand the surface composition of Saturn's icy worlds.

Lines of Inquiry

I. Titan's Hydrocarbon Lakes and Seas a) Observation of Titan's Lakes and Seas

Since 2004, Titan has been explored extensively at 2.2 cm (13.8 GHz) wavelength by the RADAR instrument through the Cassini prime mission, in scatterometery and altimetry modes, as well in the high-resolution synthetic aperture radar (SAR) mode (Elachi et al., 2005; Lunine et al. 2008; Wye et al., 2007). Radiometric data at the same wavelength were obtained concurrently in all radar modes (Janssen et al. 2009).

The observations have been interpreted to yield unique information about Titan's diverse and complex surface, which includes vast dune fields, and evidence for the shaping and evolution of the surface by fluvial erosion, putative cryovolcanism, impacts, and tectonics (Lorenz et al., 2006; Stofan et al., 2007; Lorenz et al., 2008; Le Mouélic et al., 2008; Wall et al., 2009). In particular, strong evidence has been found for liquid-filled seas and lakes on Titan, especially in the high northern latitudes (Stofan et al., 2007). The recent detection of liquid ethane in Ontario Lacus by the VIMS instrument (Visual and Infrared Mapping Spectrometer) (Barnes et al., 2009) confirmed a long-held idea that these lakes and seas are presently filled with liquid (Stofan et al., 2007; Hayes et al., 2008; Mitchell et al., in review), most likely primarily a combination of methane (due to a methane-rich atmosphere, VIMS may not detect surface methane) and ethane.

An accurate measurement of the microwave loss tangent of liquid ethane and methane and their mixture is of prime interest since it will allow the present invention to obtain a reliable estimate of the depth of the lakes. For example, the $\sim 2 \times 10^{-3}$ loss tangent obtained by Paillou et al. (2008) based on a Liquefied Natural Gas (LNG) mixture (primarily containing methane, but also ethane, and various other volatiles and hydrocarbons, including nitrogen), implies rather shallow (up to ~7 m) lakes where the bottom is even slightly visible. This is not inconsistent with observations of lake Ontario Lacus, which exhibits SAR backscatter that falls off exponentially with distance from the margins. When one extrapolates local altimeter data with slopes of $\sim 10^{-3}$, the observations would appear to suggest a loss tangent of $\sim 7.6 \times 10^{-4}$ (Hayes et al., in prep.), differing from Paillou et al.'s (2008) measurement by a factor of less than two.

However, this contrasts with more direct stereo bathymetric measurements of the depth of seas in the Arctic calculated from stereo mappings (Digital Topographic Mapping, or DTM) of the polar regions led by collaborator R. Kirk (Kirk et al., 2010). A surprising result has been the apparent success of the automatic image-matching algorithm in very dark portions of the seas, though not in the darkest and completely featureless areas. The DTM indicates a few hundred meters of relief in areas believed to be liquid-covered. Some of the DTM results in the darker parts of the seas may well result from spurious matching between speckle noise in the images, but substantial portions with backscatter cross-sections between −10 and −15 db (e.g., around the northern sides of Mayda Insula) clearly show channels and other features common to both images of the pair, and manual measurements of these features confirm that their elevations vary by up to several hundred meters.

The apparent contradiction with Paillou et al.'s (2008) measurement has not yet been explained. One possibility is that the moderately-dark areas are not in fact liquid-filled seas of varying depth, but are relatively smooth, perhaps swampy, exposed surfaces of varying texture. This would, however, seem to be at odds with (a) the observation that all near-circular lakes appear to get progressively darker towards the middle until they reach the noise floor, and (b) an analysis of a channel that extends into one of the polar seas and gets consistently darker downstream, a result that indicates strongly imaging through progressively greater depths of liquid.

The laboratory results of Paillou et al. represent only one value for absorptivity of liquid hydrocarbon that may not be representative of all seas and lakes, and that Titan's seas are sufficiently transparent that the radar is indeed seeing the bottom through up to a few hundred meters of liquid.

The seas have also been observed radiometrically. The Cassini RADAR instrument includes a passive mode able to acquire data with, or separately from, the active measurements. Over the past 4 years, the Cassini radiometer has observed the 2.2 cm thermal emission from Titan's surface at resolutions ranging from 5 to 500 km, and at a variety of emission angles and polarizations. 98% of the surface has been mapped by the radiometer, and nearly 30% with a high resolution, enabling the construction of a global map of the brightness temperature corrected to normal incidence (Janssen et al., 2009).

The radar-dark seas and lakes observed at closest approach are well resolved on the radiometry map. They appear as high emissivity (radiometrically warm) regions surrounded by terrain of lower emissivity, consistent with a dielectric constant of about 1.7, and an equator-to-pole temperature gradient of about 2 K. The brightness temperature mosaic revealed differences between lakes that might indicate different composition. An accurate knowledge of the dielectric properties of liquid ethane/methane mixtures will allow a better interpretation of the data collected over the winter (when the evaporation can be neglected and thus the physical temperature of the lakes taken as constant), and may ultimately lead to a classification of the lakes as a function of their ethane/methane ratio.

Another aspect of importance is that when winter underway in the northern latitudes, the volumes and mixing ratio of ethane and methane (the more volatile liquid) in the lakes might change; over the course of the Cassini mission, one may be observing the lakes for a total of ~10 terrestrial years, which is approximately one third of a Saturn/Titan year, and so seasonal changes may be observed. Establishing a semi-empirical mixing law for the dielectric properties of a ethane/methane solution will enable a better understanding of the impact of the seasonal changes in radar observations of the lakes (a major objective of the Cassini Solstice Mission). In addition, it will help to interpret changes in the brightness temperatures of the lakes by discriminating between the effect of a change in the composition and the effect of a decrease in the physical temperature.

In addition to the atmosphere, liquids and various ices, Titan's environment contains significant amounts of hydrocarbons, organics, tholins and possibly nitriles organic materials resulting from photolysis of methane in the upper atmosphere, all of which may be dissolved to some extent in the lake liquids, and affect their dielectric properties. The present invention may also explore their impact on loss tangent, in particular, in order to assess their likely impact.

b) Radar Modeling of Titan's Lakes and Seas

The methods used for determining the relationship between observed radar backscatter, incidence angle and lake floor depth, for a two-layer surface of a complex dielectric liquid over a solid, have already been applied by Mitchell, and are summarized here. In that work, the $\sim 10^{-3}$ loss tangent of Paillou et al. (2008) was used, which may be revised in view of the results from task (2) discussed above.

Radar backscattered power, $\sigma_0$, is found in the uncorrected (for incidence angle) versions of the RADAR basic image data records (BIDR) products in the PDS archive.

The present invention may fix surface and subsurface roughness parameters for the two-layer scattering model of the lake. The surface layer is characterized by its dielectric constant (previously taken to be $\in_1 = 1.75 - 0.002j$, after liquefied natural gas (LNG) measurements), surface roughness (height standard deviation $\sigma_1$, correlation length $L_1$), and albedo (a=0.2, in order to take into account scattering by heterogeneities or suspensions in the liquid). The bottom layer is characterized by its dielectric constant ($\in_2 = 2.20 - 0.01j$ for tholins after (Rodriguez et al., 2003) if non-ice "sediment" is suspected, and $\in_2 = 3.10 - 0.000006j$ for water-ice if "bedrock" is suspected), and roughness ($\sigma_2$, $L_2$).

Using this method, the present invention may estimate the maximum observable depth on a pixel-by-pixel basis, for different materials in individual RADAR passes T16, T18, T19, T25, T28, T29 and T30 (all of which have been in PDS archive for long enough to be eligible for OPR analysis). Where stereo bathymetry is available, the present invention may intercompare with radar modeling results for the full viable range of compositions.

In doing so, the present invention may determine: (a) if these data are indeed consistent with illumination through a liquid body, (b) whether variations between lakes are consistent with changes in liquid composition, and (c) if possible, constraints by which the present invention may estimate the depth of observed features in non-stereo scenes.

During this exercise, the present invention may also look for possible changes of properties and depths as a function of latitude and elevation, drawing on 2008 Cassini Data Analysis Program (CDAP) to investigate lake elevations in the polar region.

II. Surfaces Properties of the Airless Icy Satellites of Saturn

Saturn's airless icy satellites range from planet-like geologically active worlds to small irregular objects. Their spectra imply compositions of mostly water ice (Clark et al., 1986), but their respective evolutionary history and near environment have lead to different regolith composition and structure. Investigating the radar and radiometric properties of the icy satellites' surface can help estimating their degree of purity and maturity as well as their possible composition, and therefore provide insight on the various physical and geological processes that have affected them. Yet, such effort requires knowledge of the microwave dielectric properties of the ice mixed with different contaminants at the relevant temperatures.

a) Radar and Radiometric Observations of Saturnian Airless Icy Satellites

During the 2004 through 2007 oppositions of the Saturn system, Black et al. (2007) observed the mid-size Saturnian satellites Rhea, Dione, Tethys, and Enceladus with the Arecibo Observatory's 13 cm wavelength (2.38 GHz) radar system and measured their bulk radar reflectance properties. Early on, Black et al. (2004) had used the same radar system to observe Iapetus' optically bright, trailing hemisphere and the optically dark, leading hemisphere of Iapetus.

Concurrently, since Saturn orbit insertion in 2004, the Cassini RADAR has acquired a wealth of radar data on Saturn's main airless icy satellites, namely Mimas, Phoebe, Enceladus, Tethys, Dione, Rhea, Hyperion and Iapetus (Ostro et al., 2006; Ostro et al., 2009). With the exception of one close flyby of Iapetus, all these observations were distant ones and therefore designed largely for disk-integrated albedo calculations at 2.2 cm. Radiometric data obtained concurrently provide the thermal radiometric brightness of the icy satellites at the same wavelength.

On Sep. 10, 2007, the Cassini spacecraft encountered Iapetus at an altitude near 20,000 km and collected radar and radiometric measurements on the leading side of the moon, imaging its dark terrains and part of the bright terrains of the North and South polar caps.

The datasets listed above are all publicly available, either in literature or in the PDS archive.

b) Characterization of the Icy Satellites Surfaces and Near-surfaces

At temperatures as low as 100 K, surfaces made of water ice, if fresh and clean, have negligible absorption length at radio wavelength (Thompson and Squyres, 1990; Maetzler, 1998; Lorenz, 1998). The general understanding gained so far about the radar properties of the icy surfaces of the Saturn system, including Titan, is that they are precisely characterized by relatively much lower loss compared to other solar system surfaces (Wye et al., 2007; Janssen et al., 2009). The dominant reflection mechanism in the microwave domain is therefore expected to be subsurface volume scattering due to inhomogeneities within the low-loss subsurface medium. This mechanism has been advanced to explain the radar reflective properties of the Galilean satellites from Earth-based radar (Ostro, 1993; Black et al., 2001).

However, the icy satellites exhibit different radar signatures and longitudinal variations that may be indicative of differences in the electrical properties and thus in composition of the regolith. In particular, Ostro et al. (2006; 2009) invoke an increase in surface contaminants of Saturnian satellites with distance from Saturn to explain the observed proportional decrease in radio albedo from Enceladus to Phoebe. The purity of Enceladus' regolith may be due to its ongoing geologic activity and the resultant resurfacing by fresh water ice.

The wavelength dependence of radar properties is a further argument for the likely presence of non-ice material in the icy regolith of the Saturnian satellites (Black et al., 2007; Ostro et al., 2006, 2009). The 13 cm wavelength radar albedos are systematically lower than similar results from the Cassini RADAR instrument at 2.2 cm, suggesting a gradient in composition with depth. The most striking observation concerns Iapetus. This Saturnian moon is famous for the dramatic and unique albedo asymmetry between its leading and trailing hemispheres. The Cassini RADAR observations of Iapetus mimic the optical ones (Ostro et al., 2006), whereas the ground-based 13 cm radar measurements show hardly any hemispheric dichotomy (Black et al., 2004). This means that the dark material of Iapetus, the source of which is unknown, is thin. It also implies that multiple volume scattering is not as effective at 13 cm as it is at 2 cm. Black et al. (2004) and Ostro et al. (2009) argue that, since Iapetus' entire surface is mature regolith, the wavelength dependence must involve composition rather than structure. Either the composition is a function of depth everywhere (with electrical loss much greater at depths greater than a decimeter or two), or the regolith material is dispersive (with higher losses at higher wavelength).

Both Black et al. (2004) and Ostro et al. (2009) point to ammonia as the most likely contaminant of the icy satellites' regolith, because it is known to reduce the radar albedo without affecting the visual albedo (Lorenz, 1998). Ammonia is indeed expected to be a dominant contaminant due to the cool temperature in the Saturnian nebula (Lewis, 1972). It has been unequivocally detected on Enceladus (Emery et al., 2005; Verbiscer et al., 2006).

However, the present invention can think of other candidates that would increase the absorptivity of the regolith: 1) from cosmo-chemical considerations it can be argued that silicate minerals should be present on the surfaces of the icy satellites (Lewis, 1971), 2) organics such as nitriles, acetylene polymers or tholins have been detected in the spectra of a number of satellites (Owen et al., 2001; Buratti et al., 2005), 3) the presence of metallic iron oxides, for instance, in the form of iron-bearing grains has been advanced (Brown et al., 2006; Filacchione et al., 2009, submitted). The water ice can also be mixed with other frozen volatiles such as methane, carbon monoxides, nitrogen, carbon dioxide, or sulfur dioxide.

Dielectric measurements on various ice mixtures are crucial to be able to properly use the available radar and radiometry observations of the Saturn's icy satellites to constrain the nature and the concentration of the contaminant in their near surface. These measurements will be also useful for the understanding of the surfaces of the Galilean satellites.

III. Properties of Titan's Solid Surface

The candidates for Titan's surface materials are similar to the icy satellites' ones, though likely structurally different.

Plausible cryovolcanic landforms have been identified on Titan (Nelson et al., 2009; Wall et al., 2009), and prompt measurements on ammonia-rich water ice samples (Mitri et al., 2008).

However, Titan's atmospheric and crystal volatile chemistry produce a complex assemblage of materials, in some cases beyond those of other icy bodies that may be mobilized surficially and in the upper crust. Therefore, in addition to water ice mixtures, candidates for Titan's solid surface should include an accumulation of photochemically-produced organic materials (tholins) resulting from methane in the upper atmosphere, and various processed materials developing from this precipitate (as in the dunes fields).

Resultant data may be compared to the knowledge of the dielectric properties of the main geological units of Titan obtained from the scatterometry analysis (Wye et al., 2007; Wye et al., 2008) and the radiometry polarimetric measurements (Janssen et al., 2009).

Overview of Measurements

Once the experimental 13.8 GHz microwave cavity is validated using liquid nitrogen, whose dielectric properties are known (Smith et al. 1991), the present invention may perform dielectric measurements on pure methane. The gas handling system may be consistent with safety requirements of various entities (e.g. JPL).

From these initial measurements, the present invention may determine if modifications to the experimental set up are necessary.

The present invention may then perform measurements on pure ethane and on methane/ethane mixtures covering the range of ethane from 0% to 100% in 10% intervals.

Then, mixture measurements may be performed that include dissolved nitrogen and solid solutes (such as ammonia or tholins) for comparison.

The present invention may also perform 13.8 GHz and 2.38 GHz measurements on ice solids relevant to the surfaces of icy satellites.

Measurements on solids may involve pure water ice ($H_2O$), ammonia-rich water ice and water ice mixed with other frozen volatiles (methane, carbon monoxides, nitrogen, carbon dioxide, or sulfur dioxide) at the relevant temperatures. Samples of water ice mixed with contaminant such as silicates, organics, and iron oxides may also be studied.

Perceived Impact to State of Knowledge

The full interpretation of the radar and radiometry observations of Saturn's icy satellites depends critically on understanding the dielectric properties of potential surface materials. Thus, the present invention may obtain and study the dielectric properties of relevant liquids and solids for Saturn's icy satellites.

The present invention may also provide independent data to support (or refute) the interpretation of present-day liquid lakes on Titan, and may improve constrains on lake depths, volumes and potentially compositions, which are important to understanding Titan's carbon/organic cycle, and inevitably the evolution of its environment.

The present invention's measurements on solid samples may help constraining the surface composition of the icy satellites of Saturn and thus provide critical insight into the unique processes that have shaped them.

Relevance to Element Programs and Objectives in the NRA

The present invention is relevant to NASA's strategic plan, to "advanced scientific knowledge of the origin and history of the solar system . . . " and contributing to ". . . learning how the Sun's family of planets and minor bodies originated and evolved."

The research is relevant to the objects of "Enhancing the scientific return from the New Horizons, Cassini, Galileo, Voyager, Pioneer, and Ulysses missions by continuing the analysis of their respective data sets through broadened scientific participation," "Improving our understanding of the evolution of the outer Solar System, including the giant planets, their satellites, and other small bodies," and "Creating data products useful to the broad scientific community." The approach to be developed here promises to yield significant insight into Titan hydrological/hydrocarbon research. It also provides a clear path to future studies, specifically the analysis of the radar properties of icy worlds' solids.

The present invention may help to understand data from Cassini/Huygens studies of Titan, and other satellites that have only recently been released to the PDS archive. The present invention may help to fully appreciate the discoveries made by the Cassini-Huygens and Galileo missions on icy satellites' surfaces, and may be of great importance to support the preparation of flagship missions to Europa and the Jupiter System, and to Enceladus and Titan.

However, many applications are envisaged for the present invention. Applications for the present invention are not limited to those applications described herein.

Hardware Environment

Figure 9:
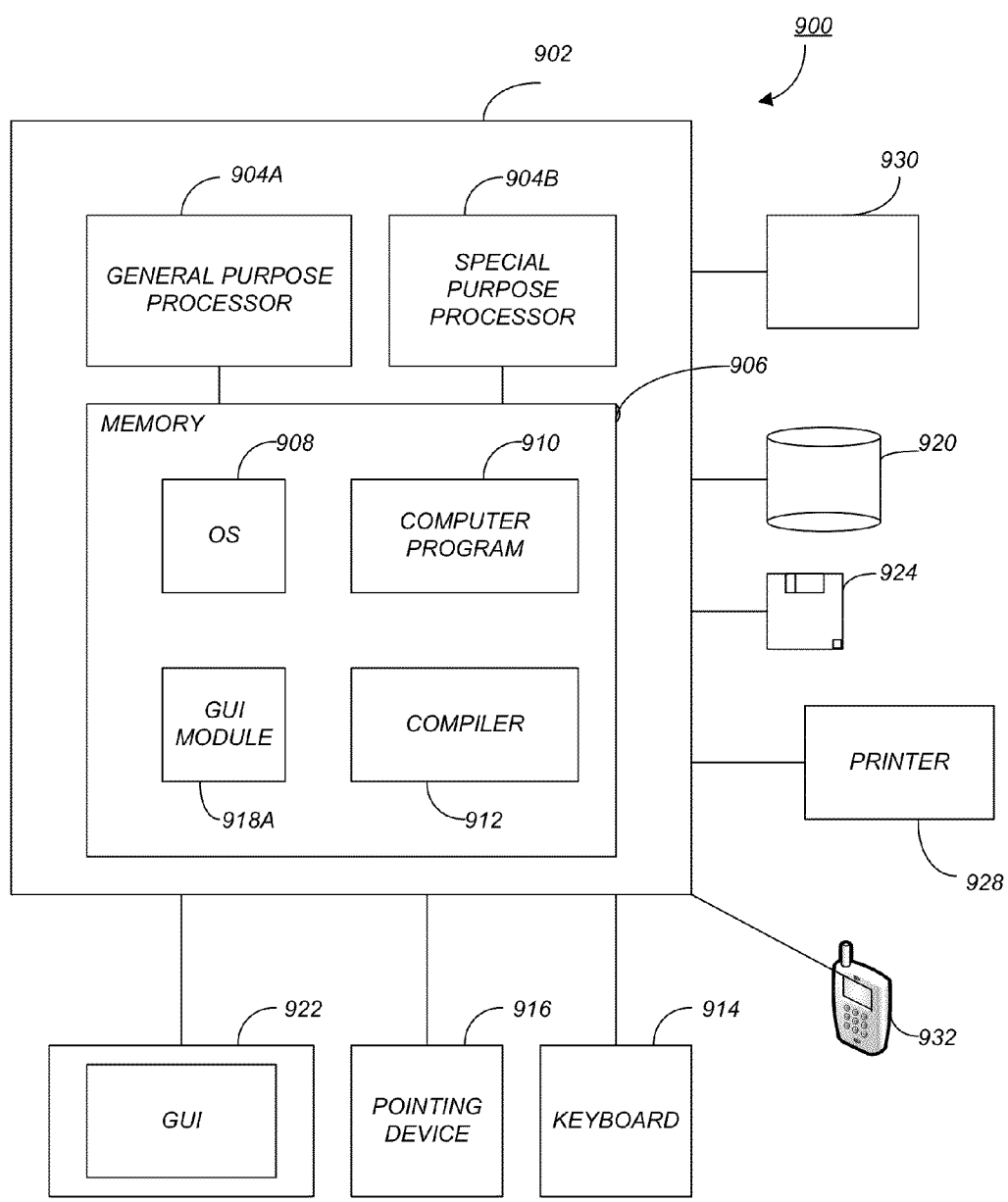
FIG. 9 is an exemplary hardware and software environment used to implement one or more embodiments of the invention.

FIG. 9 is an exemplary hardware and software environment 900 used to implement one or more embodiments of the invention. The hardware and software environment includes a computer 902 and may include peripherals. Computer 902 may be a user/client computer, server computer, or may be a database computer. The computer 902 comprises a general purpose hardware processor 904A and/or a special purpose hardware processor 904B (hereinafter alternatively collectively referred to as processor 904) and a memory 906, such as random access memory (RAM). The computer 902 may be coupled to other devices, including input/output (I/O) devices such as a keyboard 914, a cursor control device 916 (e.g., a mouse, a pointing device, pen and tablet, etc.) and a printer 928. In one or more embodiments, computer 902 may be coupled to a media viewing/listening device 932 (e.g., an MP3 player, iPod™, Nook™, portable digital video player, cellular device, personal digital assistant, etc.). In one or more embodiments, computer 902 may be coupled to a VNA, or other devices used to measure the cavity complex valued resonant frequencies.

In one embodiment, the computer 902 operates by the general purpose processor 904A performing instructions defined by the computer program 910 under control of an operating system 908. The computer program 910 and/or the operating system 908 may be stored in the memory 906 and may interface with the user and/or other devices to accept input and commands and, based on such input and commands and the instructions defined by the computer program 910 and operating system (OS) 908 to provide output and results.

Output/results may be presented on the display 922 or provided to another device for presentation or further processing or action. In one embodiment, the display 922 comprises a liquid crystal display (LCD) having a plurality of separately addressable liquid crystals. Each liquid crystal of the display 922 changes to an opaque or translucent state to form a part of the image on the display in response to the data or information generated by the processor 904 from the application of the instructions of the computer program 910 and/or operating system 908 to the input and commands. The image may be provided through a graphical user interface (GUI) module 918A. Although the GUI module 918A is depicted as a separate module, the instructions performing the GUI functions can be resident or distributed in the operating system 908, the computer program 910, or implemented with special purpose memory and processors.

Some or all of the operations performed by the computer 902 according to the computer program 910 instructions may be implemented in a special purpose processor 904B. In this embodiment, the some or all of the computer program 910 instructions may be implemented via firmware instructions stored in a read only memory (ROM), a programmable read only memory (PROM) or flash memory within the special purpose processor 904B or in memory 906. The special purpose processor 904B may also be hardwired through circuit design to perform some or all of the operations to implement the present invention. Further, the special purpose processor 904B may be a hybrid processor, which includes dedicated circuitry for performing a subset of functions, and other circuits for performing more general functions such as responding to computer program instructions. In one embodiment, the special purpose processor is an application specific integrated circuit (ASIC).

The computer 902 may also implement a compiler 912 which allows an application program 910 written in a programming language such as COBOL, Pascal, C++, FORTRAN, or other language to be translated into processor 904 readable code. After completion, the application or computer program 910 accesses and manipulates data accepted from I/O devices and stored in the memory 906 of the computer 902 using the relationships and logic that was generated using the compiler 912.

The computer 902 also optionally comprises an external communication device such as a modem, satellite link, Ethernet card, or other device for accepting input from and providing output to other computers 902.

In one embodiment, instructions implementing the operating system 908, the computer program 910, and the compiler 912 are tangibly embodied in a computer-readable medium, e.g., data storage device 920, which could include one or more fixed or removable data storage devices, such as a zip drive, floppy disc drive 924, hard drive, CD-ROM drive, tape drive, etc. Further, the operating system 908 and the computer program 910 are comprised of computer program instructions which, when accessed, read and executed by the computer 902, causes the computer 902 to perform the steps necessary to implement and/or use the present invention or to load the program of instructions into a memory, thus creating a special purpose data structure causing the computer to operate as a specially programmed computer executing the method steps described herein. Computer program 910 and/or operating instructions may also be tangibly embodied in memory 906 and/or data communications devices 930, thereby making a computer program product or article of manufacture according to the invention. As such, the terms "article of manufacture," "program storage device" and "computer program product" as used herein are intended to encompass a computer program accessible from any computer readable device or media.

Of course, those skilled in the art will recognize that any combination of the above components, or any number of different components, peripherals, and other devices, may be used with the computer 902.

Although the term "user computer" or "client computer" is referred to herein, it is understood that a user computer 902 may include portable devices such as cell phones, notebook computers, pocket computers, or any other device with suitable processing, communication, and input/output capability.

Figure 10:
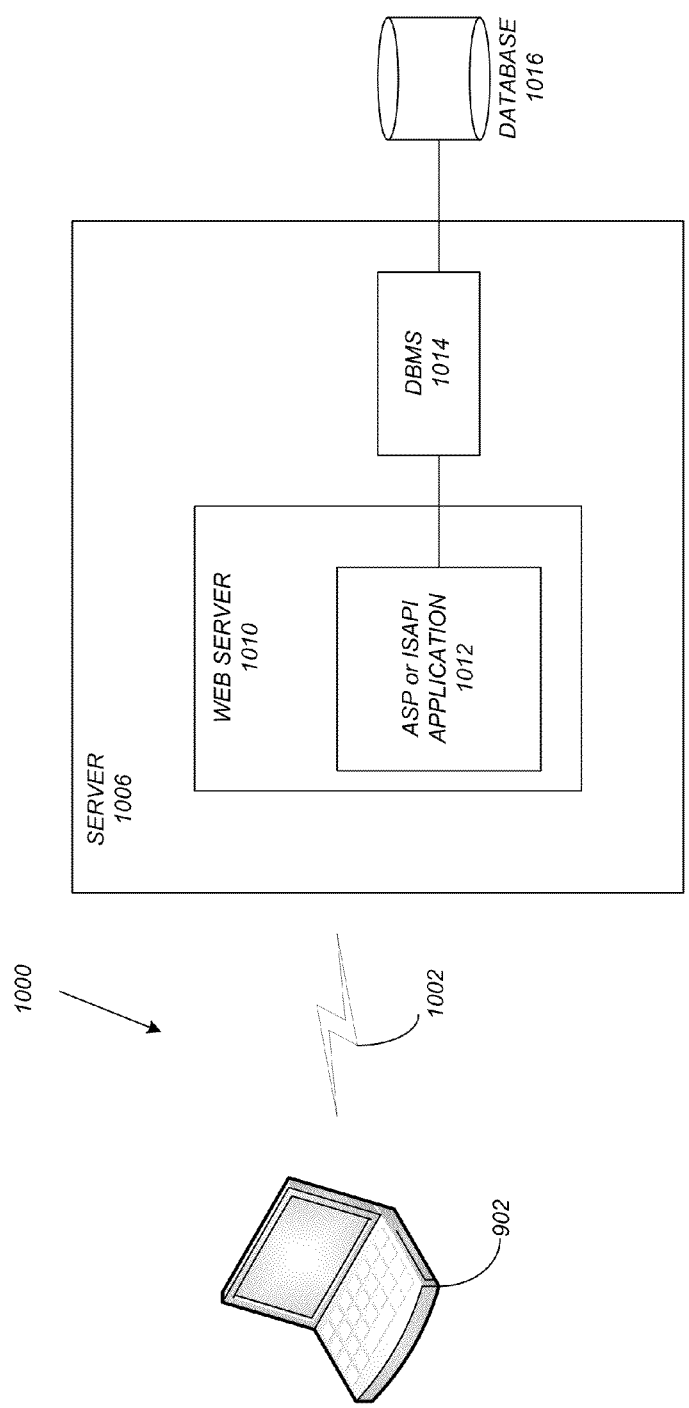
FIG. 10 schematically illustrates a typical distributed computer system using a network to connect client computers to server computers, according to one or more embodiments of the present invention.

FIG. 10 schematically illustrates a typical distributed computer system 1000 using a network 1002 to connect client computers 902 to server computers 1006. A typical combination of resources may include a network 1002 comprising the Internet, LANs (local area networks), WANs (wide area networks), SNA (systems network architecture) networks, or the like, clients 902 that are personal computers or workstations, and servers 1006 that are personal computers, workstations, minicomputers, or mainframes (as set forth in FIG. 9).

A network 1002 such as the Internet connects clients 902 to server computers 1006. Network 1002 may utilize ethernet, coaxial cable, wireless communications, radio frequency (RF), etc. to connect and provide the communication between clients 902 and servers 1006. Clients 902 may execute a client application or web browser and communicate with server computers 1006 executing web servers 1010. Such a web browser is typically a program such as MICROSOFT INTERNET EXPLORER™, MOZILLA FIREFOX™, OPERA™, APPLE SAFARI™, etc. Further, the software executing on clients 902 may be downloaded from server computer 1006 to client computers 1002 and installed as a plug in or ACTIVEX™ control of a web browser. Accordingly, clients 902 may utilize ACTIVEX™ components/component object model (COM) or distributed COM (DCOM) components to provide a user interface on a display of client 902. The web server 910 is typically a program such as MICROSOFT'S INTERNET INFORMATION SERVER™.

Web server 1010 may host an Active Server Page (ASP) or Internet Server Application Programming Interface (ISAPI) application 1012, which may be executing scripts. The scripts invoke objects that execute business logic (referred to as business objects). The business objects then manipulate data in database 1016 through a database management system (DBMS) 1014. Alternatively, database 1016 may be part of or connected directly to client 902 instead of communicating/obtaining the information from database 1016 across network 1002. When a developer encapsulates the business functionality into objects, the system may be referred to as a component object model (COM) system. Accordingly, the scripts executing on web server 1010 (and/or application 1012) invoke COM objects that implement the business logic. Further, server 1006 may utilize MICROSOFT'S™ Transaction Server (MTS) to access required data stored in database 1016 via an interface such as ADO (Active Data Objects), OLE DB (Object Linking and Embedding DataBase), or ODBC (Open DataBase Connectivity).

Generally, these components 1006-1016 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the term "user computer", "client computer", and/or "server computer" is referred to herein, it is understood that such computers 902 and 1006 may include portable devices such as cell phones, notebook computers, pocket computers, or any other device with suitable processing, communication, and input/output capability.

Of course, those skilled in the art will recognize that any combination of the above components, or any number of different components, peripherals, and other devices, may be used with computers 902 and 1006.

Software Embodiments

Embodiments of the invention are implemented as a software application on a client 902 or server computer 1006.

References

The following references are incorporated by reference herein.

Barnes, J. W., R. H. Brown, J. M. Soderblom, L. A. Soderblom, R. Jaumann, B. Jackson, S. Le Mouélic, C. Sotin, B. J. Buratti, K. M. Pitman, K. H. Baines, R. N. Clark, P. D. Nicholson, E. P. Turtle and J. Perry, "Shoreline features of Titan's Ontario Lacus from Cassini/VIMS observations," Icarus 201, 217-225, 2009.

Barmatz, M, "Microwave Dielectric Property Measurements of Icy Materials and Applications: A New Technique for Performing Dielectric Property Measurements," presented at the first internal JPL Ices Labs Workshop, Feb. 3, 2009.

Barmatz, M and, Jackson, H. W. "Technique for Performing Dielectric Property Measurements at Microwave Frequencies," at http://www.techbriefs.com/component/content/article/8328 and page 58 of Tech Briefs, August 2010 issue (Books and Reports).

Black, G. J., Campbell, D. B., Nicholson, P. D., "Icy Galilean satellites: Modeling radar reflectivities as a coherent backscatter effect," Icarus 151, 167-180, 2001.

Black, G. J., D. B. Campbell, L. M. Carter, S. J. Ostro, "Radar detection of Iapetus," Science 304, 553, 2004.

Black, G. J., D. B. Campbell, L. M. Carter, "Arecibo radar observations of Rhea, Dione, Tethys, and Enceladus," Icarus 191 702-711, 2007.

Brown, R. H., K. H. Baines, G. Bellucci, B. J. Buratti, F. Capaccioni, P. Cerroni, R. N. Clark, A. Coradini, D. P. Cruikshank, P. Drossart, V. Formisano, R. Jaumann, Y. Langevin, D. L. Matson, T. B. McCord, V. Mennella, R. M. Nelson, P. D. Nicholson, B. Sicardy, C. Sotin, N. Baugh, C. A. Griffith, G. Hansen, K. Hibbitts, T. W. Momary and M. R. Showalter, "Observations of the Saturn system during approach and orbital insertion, with Cassini's Visual and Infrared Mapping Spectrometer (VIMS)," Astron. Astrophys. 446, 707-716, 2006.

Clark, R. N., Fanale, F. P., & Gaffey, M. J., in Satellites, ed. J. A. Burns, & M. S. Matthews (Univ. of Arizona Press), 437, 1986.

Elachi, C., S. Wall, M. Allison, Y. Anderson, R. Boehmer, P. Callahan, P. Encrenaz, E. Flamini, G. Franchescetti, Y. Gim, G. Hamilton, S. Hensely, M. A. Janssen, W. Johnston, K. Kelleher, R. Kirk, R. Lopes, R. Lorenz, J. Lunine, D. Muhleman, S. Ostro, F. Paganelli, G. Picardi, F. Posa, L. Roth, R. Seu, S. Shaffer, L. Soderblom, B. Stiles, E. Stofan, S. Vetrella, R. West, C. Wood, L. Wye, H. Zebker, "Cassini Radar Views the Surface of Titan," Science 308, 970-974, 13 May 2005.

Emery, J., D. Burr, D. Cruikshank, R. Brown, and J. Dalton, "Near-infrared (0.8-4.0 m) spectroscopy of Mimas, Enceladus, Tethys, and Rhea," Astronomy and Astrophysics, 435 (1), 353-362, 2005.

Filacchione, G. et al., "Saturn's icy satellites investigated by Cassini-VIMS. II. Results at the end of nominal mission," Icarus, submitted, 2009.

Ghodgaonkar, D. K., V. V. Varadan, and V. K. Varadan, "A free-space method for measurement of dielectric constants and loss tangents at microwave frequencies," IEEE Trans. Instrum. Meas., 38(3), 789-796, 1989.

Hayes, A., et al., "Hydrocarbon lakes on Titan: Distribution and interaction with a porous regolith," Geophys. Res. Lett. 35, 9204-+, doi:10.1029/2008GL033409, 2008.

Hayes, A. G, et al. (in prep.) "Bathymetry and absorptivity of Titan's Ontario Lacus," submitted to J. Geophys. Res.

Jackson, H. W., M. Barmatz, and P. Wagner, "Microwave Power Absorption Profile in a Cylindrical Sample Contained in a Resonant Cylindrical Cavity," MRS Symp. Proc., Vol. 347, 317, 1994.

Janssen, M. A., R. D. Lorenz, R. West, F. Paganelli, R. M. Lopes, R. L. Kirk, C. Elachi, S. D. Wall, W. T. K. Johnson, Y. Anderson, R. A. Boehmer, P. Callahan, Y. Gim, G. A. Hamilton, K. D. Kelleher, L. Roth, B. Stiles, and the Cassini Radar Team, "Titan's surface at 2.2-cm wavelength imaged by the Cassini RADAR radiometer: calibration and first results," Icarus, 200, 222-239, doi: 10.1016/j.icarus. 2008.10.017, 2009.

Kirk, R. L., Howington-Kraus, E., Redding, B. L., Becker, T. L., Lee, E. M., Stiles, B. W., Hensley, S., Hayes, A. G., Lopes, R. M. C., Lorenz, R. D., Mitchell, K. L., Radebaugh, J., Paganelli, F., Soderblom, L. A., Stofan, E. R., Wall, S. D., Wood, C. A., Elachi, C., and the Cassini RADAR Team, "Three-Dimensional Views of Titan's Diverse Surface Features from Cassini RADAR Stereogrammetry," Icarus, in revision, 2010.

Le Mouélic, S., P Paillou, M. A. Janssen, J. W. Barnes, S. Rodriguez, C. Sotin, R. H. Brown, K. H. Baines, B. J. Buratti, R. N. Clark, M. Crapeau, P. J. Encrenaz, R. Jaumann, D. Geudtner, F. Paganelli, L. Soderblom, G. Tobie, S. Wall. "Joint analysis of Cassini VIMS and RADAR data: Application to the mapping of Sinlap crater on Titan," J. Geophys. Res 113, E04003, doi:10.1029/2007JE002965, 2008.

Lewis, J. S., Satellites of the outer planets: Their chemical and physical nature, Icarus 15, 174-185, 1971.

Lewis, J. S., "Low-temperature condensation from the solar nebula," Icarus 16, 241-252, 1972.

Lorenz, R. D., "Preliminary measurements of the cryogenic dielectric properties of water-ammonia ices: Application to radar observations of icy satellites," Icarus 136, 344-348, 1998.

Lorenz, R., "Calorimetric Radar Absorptivity Measurements using a Microwave Oven," Measurement Science and Technology 10, L29-L32 1999.

Lorenz, R. D., and S. E. Shandera, "Physical properties of ammonia rich ice: Application to Titan," Geophys. Res. Lett., 28, 215-218, 2001.

Lorenz, R. D., et al., Cassini Radar: "Prospects for Titan surface investigations using the microwave radiometer," Planet. Space Sci., 51, 353-364, 2003.

Lorenz, R. D., S. Wall, J. Radebaugh, G. Boubin, E. Reffet, M. A. Janssen, E. Stofan, R. Lopes, R. Kirk, C. Elachi, J. Lunine, K. Mitchell, F. Paganelli, L. Soderblom, C. Wood, L. Wye, H. Zebker, Y. Anderson, S. Ostro, M. Allison, R. Boehmer, P. Callahan, P. Encrenaz, G. G. Ori, G. Francescetti, Y. Gim, G. Hamilton, S. Hensely, W. Johnson, K. Kelleher, D. Muhleman, G. Picardi, F. Posa, L. Roth, R. Seu, S. Shaffer, B. Stiles, S. Vetrella, E. Flamini, R. West, "The Sand Seas of Titan: Cassini RADAR Observations of Longitudinal Dunes," Science 312, 970-974, May 5, 2006.

Lorenz, R. D., R. M. Lopes, F. Paganelli, J. I. Lunine, R. L. Kirk, L. A. Soderblom, E. Stofan, G. Ori, M. Myers, H. Miyamoto, B. Stiles, S. D. Wall, C. A. Wood, and the Cassini RADAR Team, "Fluvial Channels on Titan: Meteorological Paradigm and Cassini RADAR Observations," Planetary and Space Science, 56, 1132-1144, 2008

Maetzler, in Solar System Ices, B. Schmitt, C. DeBergh, and M. Festou, Eds., pp. 241-257, Kluwer Academic, Dordrecht, 1998.

Meng, B., J. Booske, R. Cooper, "Extended Cavity Perturbation Technique to Determine the Complex Permittivity of Dielectric Materials," IEEE Trans. Microwave. Theory Tech. 43, 2633, 1995.

Mitchell, K. L., Stofan, E. R., Radebaugh, J., Paillou, P., Hayes, A., Lunine, J. I., Lorenz, R. D., Stiles, B. W., Lopes, R. M., Wall, S. D., Ventura, B., Notarnicola, C., Casarano, D., Mitri, G., Janssen, M., Farr, T. G., Ostro, S. J. (in review) "Titan's north polar lake district: Insights from the Cassini Titan Radar Mapper," Submitted to Icarus.

Mitri, G., A. P. Showman, J. I. Lunine, R. M. C. Lopes, "Resurfacing of Titan by ammonia-water cryomagma," Icarus 196, 216-224, 2008.

Ostro, S. J., "Planetary radar astronomy." Rev. Mod. Phys. 65, 1235-1279, 1993.

Ostro, S. J., R. D. West, M. A. Janssen, R. D. Lorenz, H. A. Zebker, G. J. Black, J. I. Lunine, L. C. Wye, R. M. Lopes-Gautier, S. J. Wall, C. Elachi, L. Roth, S. Hensley, K. Kelleher, G. A. Hamilton, Y. Gim, Y. Z. Anderson, R. A. Boehmer, W. T. K. Johnson, and the Cassini RADAR Team, "Cassini RADAR Observations of Enceladus, Tethys, Dione, Rhea, Iapetus, Hyperion, and Phoebe," Icarus 183, 479-490, 2006.

Ostro, S. J., R. D. West, L. C. Wye, H. A. Zebker, M. A. Janssen, B. Stiles, K. Kelleher, Y. Z. Anderson, R. A. Boehmer, P. Callahan, Y. Gim, G. A. Hamilton, W. T. K. Johnson, C. Veeramachaneni, R. D. Lorenz, and the Cassini RADAR Team, "New Cassini RADAR Results for Saturn's Icy Satellites," 2009, in press.

Paillou, P., J. Lunine, G. Ruffié, P. Encrenaz, S. Wall, R. Lorenz, and M. Janssen, "Microwave dielectric constant of Titan-relevant materials," Geophys. Res. Lett., 35, L18202, doi:10.1029/2008GL035216, 2008.

Paillou, P., K. Mitchell, S. Wall, G. Ruffié, C. Wood, R. Lorenz, E. Stofan, J. Lunine, R. Lopes, and P. Encrenaz, "Microwave dielectric constant of liquid hydrocarbons: Application to the depth estimation of Titan's lakes," Geophys. Res. Lett., 35, L05202, doi:10.1029/2007GL032515, 2008a.

D. M. Pozar, "Microwave Engineering," 3rd Edition, page 32, Eq. 1.125.

D. M. Pozar, "Microwave Engineering," 3rd Edition, page 33, Eq. 1.131.

D. M. Pozar, "Microwave Engineering," 3rd Edition, P. 268, Eq. 6.7.

Rodriguez, S., P. Paillou, M. Dobrijevic, G. Ruffié, P. Coll, J. M. Bernard, and P. Encrenaz, "Impact of tholins present in Titan's atmosphere on the Cassini Radar experiment," Icarus, 164, 213-227, 2003.

Smith, P. A., L. E. Davis, T. W. Button and N. McN Alford, "The dielectric loss tangent of liquid nitrogen," Supercond. Sci. Technol., 4, 128-129, 1991.

Sphicopoulos, T., L.-G. Bernier, and F. Gardiol, "Theoretical basis for the design of the radially stratified dielectric-loaded cavities used in miniaturised atomic frequency standards," IEE Proceedings, 131, Pt. H, No. 2, 94, 1984.

Stofan, E. R., C. Elachi, J. I. Lunine, R. D. Lorenz, B. Stiles, K. L. Mitchell, S. Ostro, L. Soderblom, C. Wood, H. Zebker, S. Wall, M. Janssen, R. Kirk, R. Lopes, F. Paganelli, J. Radebaugh, L. Wye, Y. Anderson, M. Allison, R. Boehmer, P. Callahan, P. Encrenaz, E. Flamini, G. Francescetti1, Y. Gim, G. Hamilton, S. Hensley, W. T. K. Johnson, K. Kelleher, D. Muhleman, P. Paillou, G. Picardi, F. Posa, L. Roth, R. Seu1, S. Shaffer, S. Vetrella1 & R. West, "The lakes of Titan," Nature 445, 61-64, 2007.

Thompson, W. D., and S. W. Squyres, "Titan and other icy satellites: Dielectric properties of constituent materials and implications for radar sounding," Icarus 86, 336-354, 1990.

Ulaby, F. T., R. K. Moore, and A. K. Fung, "Microwave Remote Sensing—Active and Passive, Vol. III, From Theory to Applications," Artech House, Dedham Mass., see for example, Table E.1 on page 2028, 1986

Vaid, J. K., A. Prakash, and A. Mansingh, "Measurement of dielectric parameters at microwave frequencies by cavity perturbation technique," IEEE Trans. Microwave Theory Tech., 27, 791-795, 1979.

Verbiscer, A., D. Peterson, M. Skrutskie, M. Cushing, P. Helfenstein, M. Nelson, J. Smith, and J. Wilson, "Near-infrared spectra of the leading and trailing hemispheres of Enceladus," Icarus, 182 (1), 211-223, 2006.

Wall, S. D., Lopes, R. M., Stofan, E. R., Wood, C. A., Radebaugh, J. L., Stiles, B. W., Nelson, R. M., Kamp, L. W., Janssen, M. A., Lorenz, R. L., Lunine, J. I., Farr, T. G., Mitri, G., Paillou, P., Paganelli, F., and Mitchell, K. L., "Cassini RADAR images at Hotei Arcus and western Xanadu, Titan: evidence for geologically recent cryovolcanic activity," Geophys. Res. Letters, 36, L04203, doi:10.1029/2008 GL036415, 2009.

Warren, S. G., "Optical constants of ice from the ultraviolet to the microwave," Applied Optics 23, 1206, see for example, page 1215, 1985.

Whiffen, D. H., "Measurements on the absorption of microwaves," Trans. Faraday Soc., 46, 124-130, 1950.

Wilson, C. W. Schramm and J. P. Kinzer, "High Q resonant cavities for microwave testing," in Radar Systems and Components, Members of the Technical Staff of Bell Laboratories, Van Nostrand, N.Y., P. 909 (1949).

Wye, L. C., H. A. Zebker, S. J. Ostro, R. D. West, Y. Gim, R. D. Lorenz, and the Cassini RADAR Team, "Electrical Properties of Titan's Surface from Cassini RADAR Scatterometer Measurements," Icarus 188, 367-385, 2007.

Wye, L. C., H. Zebker, R. Lopes, B. Peckyno, A. Le Gall, M. Janssen, "Surface Parameters of Titan Feature Classes From Cassini RADAR Backscatter Measurements," AGU Fall Meeting, San Francisco, USA, Dec. 15-19, 2008.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of calculating, in one or more computers, a complex-valued dielectric permittivity ($\in$) or a complex valued magnetic permeability ($\mu$) of at least one material, comprising:
   (a) receiving, in one or more of the computers, a measured complex-valued resonance frequency Fmaterial of a cavity containing the material, wherein Fmaterial is a measurement obtained by exciting the cavity with one or more transverse magnetic $TM_{0n0}$ cavity resonant modes;
   (b) in one or more of the computers:
      (1) receiving a solution of Maxwell's equations for a complex-valued resonance frequency function F of the cavity containing the material, wherein the F is a function of $\in$ or $\mu$ or $\in$ and $\mu$ of the material,
      (2) numerically or analytically solving an equation F=Fmaterial exactly for the $\in$ or the $\mu$, wherein the $\in$ or the $\mu$ is the only unknown; and
   (c) outputting, from one of the computers, the $\in$ or $\mu$.

2. The method of claim 1, wherein the cavity and the material are annular or cylindrical regions.

3. The method of claim 2, wherein the material is non-magnetic, has any cylindrical size, and is positioned along the cavity's axis.

4. The method of claim 2, wherein to obtain the $\mu$ of the material that is magnetic, the cavity resonant modes comprise at least one Transverse Magnetic ($TM_{0n0}$) mode, and a magnetic field and an electric field associated with the $TM_{0n0}$ mode, where n is an integer, the method further comprising:
  (i) performing the steps (a)-(b) for the material that is a first cylindrical material positioned along the cavity's axis, the first cylindrical material having a first radius that is sufficiently small so that the magnetic field's strength at the first radius's end is negligible, thereby allowing the Maxwell's equations and the F to be solved for only one unknown, the $\in$=Ematerial; and
  (ii) performing the steps (a)-(b) for the material that is a second cylinder comprising a same material as the first cylinder, and having a larger radius than the first radius, such that the second cylinder positioned along the axis experiences both the magnetic field and the electric field, thereby allowing the Maxwell's equations and the F to be solved for only one unknown, the $\mu$, using the $\in$=Ematerial obtained in step (i).

5. The method of claim 2, wherein to obtain the $\mu$ of the material that is magnetic, the cavity resonant modes comprise:
  a first frequency, a first magnetic field, and a first electric field associated with a first $TM_{0n0}$ mode, where n is an integer,
  a second frequency, a second magnetic field and a second electric field associated with a second $TM_{0n0}$ mode,
  the first frequency and the second frequency such that the $\in$ and the $\mu$ at the first frequency are negligibly different from the $\in$ and the $\mu$ at the second frequency; and
  the method further comprising:
  (i) exciting the cavity with the first $TM_{0n0}$ mode where the material is an annulus positioned at a radius of the cavity associated with a maximum of the first electric field and a zero of the first magnetic field;
  (ii) performing the steps (a)-(b) using the first $TM_{0n0}$ mode, thereby allowing the Maxwell's equations and the F to be solved for only one unknown, the Ematerial; and
  (iii) performing steps (a)-(b) using the second $TM_{0n0}$ mode so that the material experiences both the second electric field and the second magnetic field, thereby allowing the Maxwell's equations and the F to be solved for only one unknown, the $\mu$, using the $\in$=Ematerial obtained in step (ii).

6. The method of claim 2, further comprising:
  receiving, in one or more of the computers, a measured complex-valued resonance frequency Fcavity of the cavity without the material;
  in one or more of the computers, modifying the F to include a cavity wall loss contribution associated with a change in the transverse magnetic cavity modes' fields at the cavity's walls and electrical conductivity $\sigma_w$ of the cavity's walls, calculated from Fcavity and Fmaterial; and
  in the step (b)(2), numerically or analytically solving the equation F=Fmaterial, wherein the F is the modified function F.

7. The method of claim 6, further comprising:
  calculating, in one or more of the computers:
  the effective electrical conductivity $\sigma_w$ of the cavity's walls from
  $\sigma_w = [Q_0^2/(\pi\mu_0 f_0)](2=D_c/L)^2/D_c^2$, where $Q_0$=Re (Fcavity)/2 Im(Fcavity), $\mu_0$ is the permeability of vacuum, $f_0$=Re(Fcavity), $D_c$ is the cavity diameter, and L is the cavity length, wherein the Fcavity is the measured complex-valued resonance frequency of the cavity without the material;
  $R_\in = [(\pi\mu_0 Re[Fmaterial])/\lambda_w]^{1/2}$;
  $P_{wall} = (R_s/2)\int_S |H_t|^2 ds$, where $\int_S$ indicates an integral over the surface of the cavity walls, ds is the surface element, and $H_t$ is the magnetic field tangential component at the surface of the cavity walls for the cavity containing the material;
  $Q_{wall} = 2\pi$ Re(Fmaterial) $U/P_{wall}$ where U is the total electromagnetic energy stored in the cavity containing the material; and
  the cavity wall loss contribution $f_{wall}$=Re (Fmaterial)/2 $Q_{wall}$; and
  modifying the F into F=F+j$f_{wall}$ to account for the power $P_{wall}$ absorbed by the cavity's walls associated with the electrical conductivity; and
  solving the equation F=F+j$f_{wall}$=Fmaterial for the $\in$ or the $\mu$ in the step b(2).

8. The method of claim 6, wherein the material in the cavity is in a material holder, and the material holder has a complex-valued dielectric permittivity (Eholder), the method further comprising:
  obtaining a measured complex-valued resonance frequency Fholder of the cavity comprising the material holder without without any material in the material holder;
  solving the Maxwell's equations for a complex-valued resonance frequency g of the cavity including the material holder without any material in the material holder, wherein the g is a function of the Eholder;
  modifying the g to account for the cavity's wall losses associated with the $\sigma w$, thereby obtaining a resultant complex-valued resonant frequency G that is a function of the Eholder;
  obtaining the Eholder by solving G=Fholder; and
  performing the steps (a)-(b) for the material inserted in the material holder in the cavity, wherein the solving of F=Fmaterial uses the Eholder obtained by the solving of G=Fholder.

9. The method of claim 8, further comprising measuring the Fholder, Fcavity, and Fmaterial wherein the material is a liquid, powder, or granular material.

10. The method of claim 6, further comprising measuring the Fcavity and the Fmaterial.

11. The method of claim 1, wherein the solving further comprises:
  (i) obtaining or selecting one or more values for the $\in$ or the $\mu$;
  (ii) calculating the F for one or more of the values;
  (iii) comparing the F with Fmaterial;
  repeating steps (i)-(iii) with another of the values until the value that satisfies F=Fmaterial to any desired precision is selected.

12. The method of claim 1, wherein the cavity comprises one or more additional materials having known material dielectric permittivity and known material magnetic permeability, such that the $\in$ or $\mu$ is an only unknown during the solving step (b).

13. The method of claim 1, wherein the solving of F=Fmaterial further comprises finding roots of F−Fmaterial=0, by:
  (i) specifying a range of values for z within a first rectangle in a complex plane, wherein the z are complex numbers in a complex plane;
  (ii) introducing a mesh into the first rectangle, thereby forming the mesh comprising mesh points at corners of second rectangles, wherein the second rectangles are smaller than the first rectangles;
  (iii) evaluating Re F(z) at each of the mesh points;

(iv) determining one or more first sides of the second rectangles where the Re (F(z)) changes sign;
(v) evaluating Im F(z) at each of the mesh points;
(vi) determining one or more second sides of the second rectangles where the Im (F(∈)) changes sign;
(vii) selecting the second rectangles having both the first sides and second sides, where both the Re F(z) and the Im F(z) change sign, to obtain selected second rectangles;
(viii) interpolating the Re F(z) in the selected second rectangles to define a Re F(z) null line;
(ix) interpolating the Im F(z) in the selected second rectangles to define an Im F(z) null line;
(x) finding a first intersection point between the Re F(z) null line and the Im F(z) null line;
(xi) setting the second rectangle as the first rectangle and repeating steps (i)-(x) using the second rectangle as the first rectangle, thereby finding a second intersection point;
(xii) obtaining a difference between the first intersection point and the second intersection point, and comparing the difference with a precision parameter that is equal to a desired precision;
(xiii) repeating the method until the difference is at least as small as the precision parameter, thereby obtaining a final intersection point; and
(xiv) setting the final intersection point equal to the ∈ or μ.

14. The method of claim 1, further comprising:
using the ∈ or μ to interpret remote sensing data obtained from earth or extra-terrestrial material.

15. A non-transitory computer readable storage medium encoded with computer program instructions which when accessed by a computer cause the computer to load the program instructions to a memory therein creating a special purpose data structure causing the computer to operate as a specially programmed computer, executing a method of calculating a complex-valued dielectric permittivity (∈) or a complex valued magnetic permeability (μ) of at least one material, comprising:
(a) receiving, in the specially programmed computer, a measured complex-valued resonance frequency Fcavity of a cavity without the material;
(b) receiving, in the specially programmed computer, a measured complex-valued resonance frequency Fmaterial of the cavity containing the material, wherein Fcavity and Fmaterial are measurements obtained by exciting the cavity with one or more transverse magnetic $TM_{0n0}$ cavity resonant modes; and
(c) numerically or analytically solving, in the specially programmed computer, Maxwell's equations exactly for ∈ or μ wherein the solving includes:
(i) numerically or analytically calculating a complex valued resonance frequency F for each of one or more values of ∈ or μ, wherein the F includes a cavity wall loss contribution associated with a change in the tranverse magnetic cavity modes' fields at cavity's walls and calculated from Fcavity and Fmaterial; and
(ii) selected the ∈ or μ wherein F=Fmaterial, therby solving for the ∈ or μ; and
(d) outputting, from the specially programmed computer, the selected ∈ or μ.

16. The computer readable storage medium of claim 15, wherein the cavity and the material are annular or cylindrical regions.

17. The computer readable storage medium of claim 15, wherein, the calculating in step c(i) further comprises:
calculating, in the specially programmed computer:
an effective electrical conductivity $\sigma_w$ of the cavity's walls from
$\sigma_w = [Q_0^2/(\pi\mu_0 f_0)](2 = D_c/L)^2/D_c^2$, where $Q_0$=Re (Fcavity)/2 Im(Fcavity), $\mu_0$ is the permeability of vacuum, $f_0$=Re(Fcavity), $D_c$ is the cavity diameter, and L is the cavity length;
$R_\in = [(\pi\mu_0 \text{Re}[\text{Fmaterial}])/\lambda_w]^{1/2}$;
$P_{wall} = (R_s/2)\int_S |H_t|^2 ds$, where $\int_S$ indicates an integral over the surface of the cavity walls, ds is the surface element, and $H_t$ is the magnetic field tangential component at the surface of the cavity walls for the cavity containing the material;
$Q_{wall} = 2\pi\text{Re}(\text{Fmaterial}) U/P_{wall}$ where U is the total electromagnetic energy stored in the cavity containing the material; and
the cavity wall loss contribution $f_{wall}$=Re (Fmaterial)/2 $Q_{wall}$ to account for the $P_{wall}$ power absorbed by the cavity's walls; and
the solving in the step c(ii) comprises solving F=F+ $jf_{wall}$=Fmaterial.

18. The computer readable storage medium 17, wherein the material in the cavity is in a material holder, and the material holder has a complex-valued dielectric permittivity (Eholder), the method further comprising:
receiving, in the specially programmed computer, a measured complex-valued resonance frequency Fholder of the cavity using a $TM_{0n0}$ mode, the cavity comprising the material holder without any material in the material holder;
solving, in the specially programmed computer, the Maxwell's equations for a complex-valued resonance frequency g of the cavity including the material holder without any material in the material holder, wherein the g is a function of the Eholder;
modifying, in the specially programmed computer, the g to account for the electrical conductivity, thereby obtaining a resultant complex-valued resonant frequency G that is a function of the Eholder;
obtaining, in the specially programmed computer, the Eholder by solving G=Fholder; and
performing the steps (a)-(c) for the material inserted in the material holder in the cavity, wherein the solving of F=Fmaterial uses the Eholder obtained by the solving of G=Fholder.

19. The computer readable storage medium of claim 15, further comprising:
receiving, in the specially programmed computer, a range of values for the ∈ or μ; and
selecting, in the specially programmed computer, the value in the range that satisfies F=Fmaterial to any degree of precision.

20. The computer readable storage medium of claim 15, wherein the material is non-magnetic, has any cylindrical size, and is positioned along an axis of the cavity.

21. The computer readable storage medium of claim 15, wherein to obtain the μ of the material that is magnetic, the cavity resonant modes comprise at least one Transverse Magnetic ($TM_{0n0}$) mode, and a magnetic field and an electric field associated with the $TM_{0n0}$ mode, where n is an integer, the method further comprising:
(1) performing the steps (a)-(c) for the material that is a first cylindrical material positioned along an axis of the cavity, the first cylindrical material having a first radius that is sufficiently small so that the magnetic field's strength at the first radius's end is negligible, thereby allowing the Maxwell's equations and the F to be solved for only one unknown, the $\in$; and (2) performing the steps (a)-(c) for the material that is a second cylinder comprising a same material as the first cylinder, and having a larger radius than the first radius, such that the second cylinder positioned along the axis experiences both the magnetic field and the electric field, thereby allowing the Maxwell's equations and the F to be solved for only one unknown, the $\mu$, using the $\in$ obtained in step (1).

22. The computer readable storage medium of claim 15, wherein to obtain the $\mu$ of the material that is magnetic, the cavity resonant modes comprise:

a first frequency, a first magnetic field, and a first electric field associated with a first $TM_{0n0}$ mode, where n is an integer, a second frequency, a second magnetic field and a second electric field associated with a second $TM_{0n0}$ mode, the first frequency and the second frequency such that the $\in$ and the $\mu$ at the first frequency are negligibly different from the $\in$ and the $\mu$ at the second frequency; and the method further comprising:

(1) exciting the cavity with the first $TM_{0n0}$ mode where the material is an annulus positioned at a radius of the cavity associated with a maximum of the first electric field and a zero of the first magnetic field;

(2) performing the steps (a)-(c) using the first $TM_{0n0}$ mode, thereby allowing the Maxwell's equations and the F to be solved for only one unknown, the $\in$; and (3) performing steps (a)-(c) using the second $TM_{0n0}$ mode so that the material experiences both the second electric field and the second magnetic field, thereby allowing the Maxwell's equations and the F to be solved for only one unknown, the $\mu$, using the $\in$ obtained in step (2).

23. The computer readable storage medium of claim 15, wherein the cavity comprises one or more additional materials having known material dielectric permittivity and known material magnetic permeability, such that the $\in$ or $\mu$ is an only unknown during the solving step (c).

24. The computer readable storage medium 15, wherein the solving of F=Fmaterial further comprises finding roots of F−Fmaterial=0, by:

(i) specifying, in the specially programmed computer, a range of values for z within a first rectangle in a complex plane, wherein the z are complex numbers in a complex plane;

(ii) introducing, in the specially programmed computer, a mesh into the first rectangle, thereby forming the mesh comprising mesh points at corners of second rectangles, wherein the second rectangles are smaller than the first rectangles;

(iii) evaluating, in the specially programmed computer, Re F(z) at each of the mesh points;

(iv) determining, in the specially programmed computer, one or more first sides of the second rectangles where the Re F(z) changes sign;

(v) evaluating, in the specially programmed computer, Im F(z) at each of the mesh points;

(vi) determining, in the specially programmed computer, one or more second sides of the second rectangles where the Im F($\in$) changes sign;

(vii) selecting, in the specially programmed computer, the second rectangles having both the first sides and second sides, where both the Re F(z) and the Im F(z) change sign, to obtain selected second rectangles;

(viii) interpolating, in the specially programmed computer, the Re F(z) in the selected second rectangles to define a Re F(z) null line;

(ix) interpolating, in the specially programmed computer, the Im F(z) in the selected second rectangles to define an Im F(z) null line;

(x) finding, in the specially programmed computer, a first intersection point between the Re F(z) null line and the Im F(z) null line;

(xi) setting, in the specially programmed computer, the second rectangle as the first rectangle and repeating steps (i)-(x) using the second rectangle as the first rectangle, thereby finding a second intersection point;

(xii) obtaining, in the specially programmed computer, a difference between the first intersection point and the second intersection point, and comparing the difference with a precision parameter that is equal to a desired precision;

(xiii) repeating, in the specially programmed computer, the method until the difference is at least as small as the precision parameter, thereby obtaining a final intersection point; and (xiv) setting, in the specially programmed computer, the final intersection point equal to the $\in$ or $\mu$.

25. The computer readable storage medium of claim 15, further comprising:

using, in the specially programmed computer, the $\in$ or $\mu$ to interpret remote sensing data obtained from earth or extra-terrestrial material.

\* \* \* \* \*